United States Patent
Jeong et al.

(10) Patent No.: US 10,204,869 B2
(45) Date of Patent: *Feb. 12, 2019

(54) INTEGRATED CIRCUIT PACKAGE INCLUDING SHIELDING BETWEEN ADJACENT CHIPS

(71) Applicant: SAMSUNG ELECTRONICS CO., LTD., Suwon-si, Gyeonggi-do (KR)

(72) Inventors: Chan-hee Jeong, Asan-si (KR); Soo-jae Park, Asan-si (KR); Young-hoon Kim, Asan-si (KR); In-ku Kang, Hwaseong-si (KR); Hee-yeol Kim, Asan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/949,286

(22) Filed: Apr. 10, 2018

(65) Prior Publication Data

US 2018/0233458 A1    Aug. 16, 2018

Related U.S. Application Data

(63) Continuation of application No. 15/604,762, filed on May 25, 2017, now Pat. No. 9,978,693.

(30) Foreign Application Priority Data

Sep. 23, 2016   (KR) .................. 10-2016-0122379

(51) Int. Cl.
H01L 23/31     (2006.01)
H01L 23/552    (2006.01)
(Continued)

(52) U.S. Cl.
CPC ........ *H01L 23/552* (2013.01); *H01L 23/3121* (2013.01); *H01L 23/3157* (2013.01);
(Continued)

(58) Field of Classification Search
CPC ....... H01L 23/28; H01L 23/31; H01L 23/315; H01L 23/3157
(Continued)

(56) References Cited

U.S. PATENT DOCUMENTS 5,359,222 A   10/1994  Okutomo et al.
6,619,835 B2   9/2003  Kita
(Continued)

FOREIGN PATENT DOCUMENTS

JP   H8-28396     3/1996
JP   5751079 B2   5/2015
(Continued)

*Primary Examiner* — Victoria K Hall
(74) *Attorney, Agent, or Firm* — Lee & Morse, P.C.

(57) ABSTRACT

An integrated circuit package includes at least one first chip mounted in a first region of a mounting surface of a printed circuit board, a molding unit covering the mounting surface and surrounding the at least one first chip, an electromagnetic shielding film covering a surface of the molding unit and surrounding the at least one first chip, and a second chip mounted in a second region of the mounting surface. The second chip is exposed outside the electromagnetic shielding film and is spaced apart from the printed circuit board, with the molding unit being between the second chip and the printed circuit board.

22 Claims, 23 Drawing Sheets

(51) Int. Cl.
*H01L 23/498* (2006.01)
*H01L 25/065* (2006.01)
*H01L 25/18* (2006.01)
*H01L 23/00* (2006.01)

(52) U.S. Cl.
CPC .. *H01L 23/49811* (2013.01); *H01L 23/49838* (2013.01); *H01L 25/0655* (2013.01); *H01L 25/18* (2013.01); H01L 24/16 (2013.01); H01L 2224/16237 (2013.01); H01L 2924/15313 (2013.01); H01L 2924/181 (2013.01); H01L 2924/1815 (2013.01); H01L 2924/19105 (2013.01); H01L 2924/3025 (2013.01)

(58) Field of Classification Search
USPC .......................................................... 257/787
See application file for complete search history.

(56) References Cited

U.S. PATENT DOCUMENTS

| | | | |
|---|---|---|---|
| 7,198,987 B1 | 4/2007 | Warren et al. | |
| 7,566,584 B2 | 7/2009 | Ito | |
| 8,093,690 B2 | 1/2012 | Ko et al. | |
| 8,093,691 B1* | 1/2012 | Fuentes | H01L 23/3128 |
| | | | 257/659 |
| 8,138,062 B2 | 3/2012 | Liu et al. | |
| 8,624,364 B2 | 1/2014 | Chow et al. | |
| 8,890,265 B2 | 11/2014 | Kuratani | |
| 9,144,183 B2 | 9/2015 | Chen et al. | |
| 9,146,153 B2 | 9/2015 | Lee | |
| 9,252,108 B2 | 2/2016 | Fujimori | |
| 9,466,545 B1 | 10/2016 | Scanlan et al. | |
| 9,706,661 B2 | 7/2017 | Choi | |
| 9,768,124 B2 | 9/2017 | Scanlan et al. | |
| 9,786,623 B2 | 10/2017 | Lin | |
| 9,978,693 B2* | 5/2018 | Jeong | H01L 23/552 |
| 2006/0274517 A1* | 12/2006 | Coffy | H01L 21/561 |
| | | | 361/816 |
| 2008/0128886 A1 | 6/2008 | Kang et al. | |
| 2008/0315377 A1 | 12/2008 | Eichelberger et al. | |
| 2009/0001553 A1* | 1/2009 | Pahl | B81B 7/0064 |
| | | | 257/704 |
| 2009/0002971 A1 | 1/2009 | Carey et al. | |
| 2009/0302439 A1 | 12/2009 | Pagaila et al. | |
| 2010/0213563 A1 | 8/2010 | Lai | |
| 2012/0018876 A1* | 1/2012 | Wu | H01L 21/6835 |
| | | | 257/737 |
| 2012/0069529 A1 | 3/2012 | Chen et al. | |
| 2012/0127689 A1 | 5/2012 | McLellan et al. | |
| 2014/0085857 A1* | 3/2014 | Chen | H01L 23/49805 |
| | | | 361/818 |
| 2015/0070236 A1 | 3/2015 | Walters et al. | |
| 2016/0123816 A1 | 5/2016 | Pei et al. | |
| 2016/0163650 A1* | 6/2016 | Gao | H01L 23/49827 |
| | | | 257/773 |
| 2016/0262292 A1 | 9/2016 | Kuk et al. | |
| 2016/0276307 A1 | 9/2016 | Lin | |
| 2017/0294387 A1 | 10/2017 | Kawabata et al. | |
| 2017/0301631 A1 | 10/2017 | Lee et al. | |
| 2018/0134546 A1* | 5/2018 | Oh | B81B 7/0064 |

FOREIGN PATENT DOCUMENTS

| | | |
|---|---|---|
| KR | 10-0824562 B1 | 4/2008 |
| KR | 10-1311236 B1 | 9/2013 |
| KR | 10-1559154 B1 | 10/2015 |

* cited by examiner

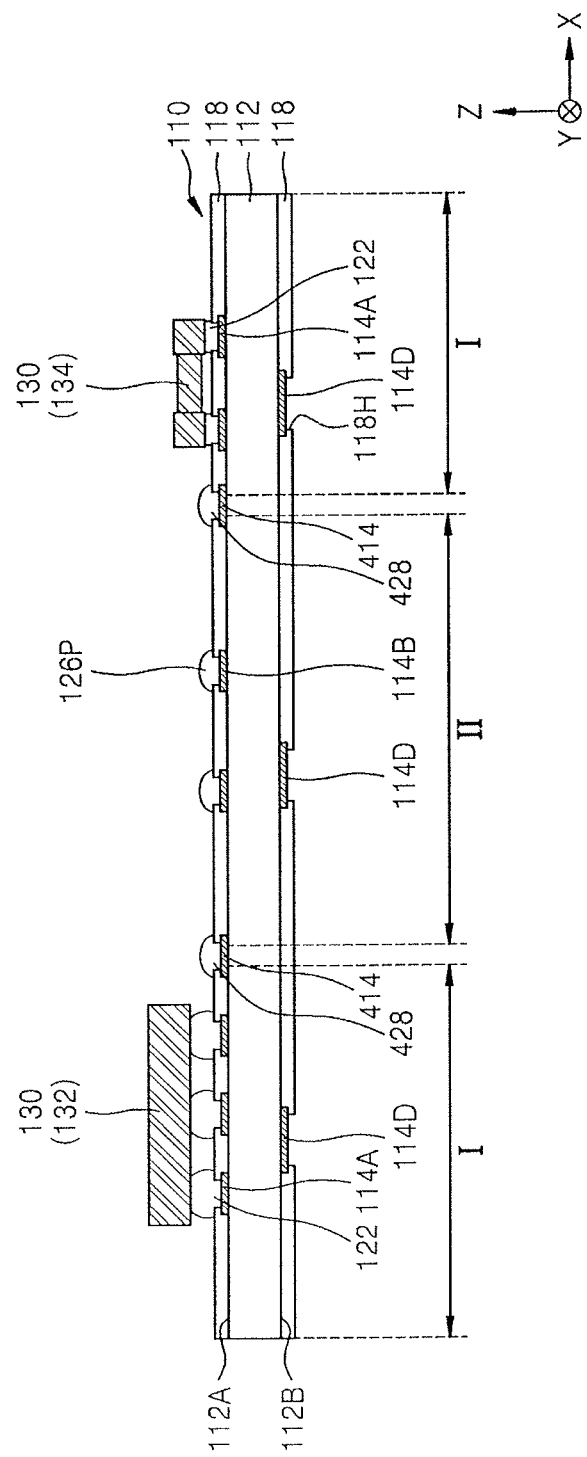

INTEGRATED CIRCUIT PACKAGE INCLUDING SHIELDING BETWEEN ADJACENT CHIPS

CROSS-REFERENCE TO RELATED APPLICATIONS

This is a continuation application based on pending application Ser. No. 15/604,762, filed May 25, 2017, now U.S. Pat. No. 9,978,693, issued May 22, 2018, the entire contents of which is hereby incorporated by reference.

Korean Patent Application No. 10-2016-0122379, filed on Sep. 23, 2016, in the Korean Intellectual Property Office, and entitled: "Integrated Circuit Package, Method of Fabricating the Same, and Wearable Device Including Integrated Circuit Package," is incorporated by reference herein in its entirety.

BACKGROUND

1. Field

Embodiments relate to an integrated circuit package, a method of fabricating the same, and a wearable device including the integrated circuit package, and, more particularly, to an integrated circuit package, which includes a semiconductor package including a plurality of chips and an electromagnetic shielding film, a method of fabricating the same, and a wearable device including the integrated circuit package.

2. Description of the Related Art

Recently, electronic devices such as smart phones have quickly been spreading, and the development and spread of system-in-package (SiP) modules and wearable devices utilizing these SiP modules have been increasing, the SiP module being obtained by integrating a plurality of individual semiconductor chips performing various functions by interworking with electronic devices into one package. SiP modules, particularly, high frequency semiconductor package modules require an electromagnetic shielding structure to secure resistance to electromagnetic interference (EMI) and/or radio frequency interference (RFI). However, some chips constituting an SiP module need to be separated from an electromagnetic shielding structure and exposed.

SUMMARY

One or more embodiments provides an integrated circuit package including: a printed circuit board; at least one first chip mounted to a first region of a mounting surface of the printed circuit board; a molding unit covering the mounting surface and surrounding the at least one first chip; an electromagnetic shielding film covering a surface of the molding unit and surrounding the at least one first chip; and a second chip, which is mounted to a second region of the mounting surface to be exposed outside the electromagnetic shielding film and is spaced apart from the printed circuit board, with the molding unit being between the second chip and the printed circuit board, wherein the molding unit includes: a chip protective molding unit covering the at least one first chip over the first region; and a substrate protective molding unit, which has a lower thickness than the chip protective molding unit, extending between the printed circuit board and the second chip and having a step and a recess surface on a top surface of the substrate protective molding unit, the recess surface being defined by the step, the recess surface being defined by the step.

One or more embodiments provides an integrated circuit package including: a printed circuit board including a mounting surface and a plurality of conductive pads exposed on the mounting surface, the mounting surface having a first region and a second region adjacent to the first region; at least one first chip mounted over the first region; a molding unit including a chip protective molding unit, which covers the at least one first chip over the first region, and a substrate protective molding unit, which has a lower thickness than the chip protective molding unit, extending on the second region and having a step and a recess surface on a top surface of the substrate protective molding unit, the recess surface being defined by the step; an electromagnetic shielding film extending to cover the molding unit on the first region and the second region and having an opening that exposes the recess surface over the second region; and a second chip, which is connected to at least one conductive pad selected from among the plurality of conductive pads through a connection member penetrating the substrate protective molding unit on the second region and is at least partially exposed outside the electromagnetic shielding film by the opening.

One or more embodiments provides a wearable device including a main body and a wearing unit for wearing the main body by a user, wherein the main body includes at least one integrated circuit device of the integrated circuit devices according to embodiments of the inventive concept.

One or more embodiments provides a method of fabricating an integrated circuit package, the method including: preparing a printed circuit board including a mounting surface and a plurality of conductive pads exposed on the mounting surface, the mounting surface having a first region and a second region adjacent to the first region; mounting at least one first chip over the first region; forming a molding unit, which covers the first region and the second region and surrounds the at least one first chip; forming an electromagnetic shielding film, which covers the molding unit on the first region and the second region; forming an opening by partially removing the electromagnetic shielding film over the second region, the opening penetrating the electromagnetic shielding film; forming a step and a recess surface on a top surface of the molding unit on the second region by partially removing the molding unit exposed by the opening; forming at least one connection hole, which penetrates the molding unit on the second region; forming a connection member in the at least one connection hole; and mounting a second chip over the second region, the second chip being connected to at least one conductive pad of the plurality of conductive pads through the connection member.

BRIEF DESCRIPTION OF THE DRAWINGS

Features will become apparent to those of skill in the art by describing in detail exemplary embodiments with reference to the attached drawings in which:

FIGS. 7A to 7E illustrate cross-sectional views of stages in a method of fabricating an integrated circuit package, according to further embodiments;

DETAILED DESCRIPTION

Figure 1:
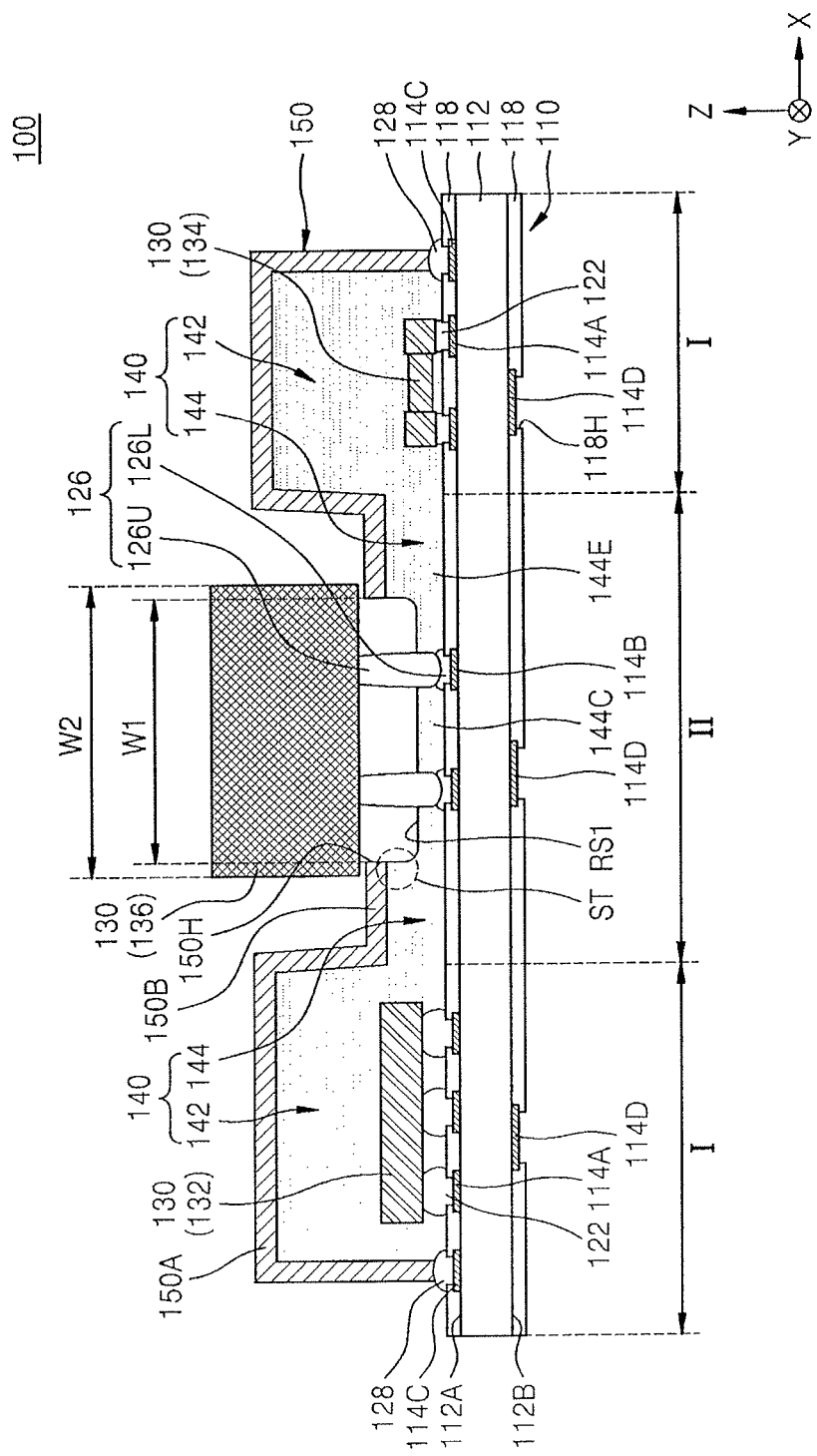
FIG. 1 illustrates a cross-sectional view of an integrated circuit package according to embodiments.

Hereinafter, embodiments will be described in detail with reference to the accompanying drawings. Like components will be denoted by like reference numerals throughout the specification, and repeated descriptions thereof will be omitted.

FIG. 1 is a cross-sectional view of an integrated circuit package according to embodiments. Referring to FIG. 1, an integrated circuit package 100 may include a printed circuit board 110, a plurality of chips 130 mounted to the printed circuit board 110, a molding unit 140 covering only some chips selected from among the plurality of chips 130, and an electromagnetic shielding film 150 covering a surface of the molding unit 140 except for an area where at least one chip of the plurality of chips 130 is exposed outside the electromagnetic shielding film 150.

The printed circuit board 110 may include a rigid printed circuit board, a flexible printed circuit board, a rigid flexible printed circuit board, or combinations thereof. The printed circuit board 110 may include a substrate main body 112 having a mounting surface 112A, to which the plurality of chips 130 are mounted, and a back surface 112B opposite to the mounting surface 112A; a plurality of conductive pads 114A, 114B, 114C, and 114D exposed on the mounting surface 112A or the back surface 112B of the substrate main body 112; and an insulating protective layer 118 exposing the plurality of conductive pads 114A, 114B, 114C, and 114D and covering the mounting surface 112A and the back surface 112B of the substrate main body 112. The insulating protective layer 118 includes a plurality of holes 118H exposing the plurality of conductive pads 114A, 114B, 114C, and 114D.

In some embodiments, the substrate main body 112 may have a single layer structure of a single base substrate including a plurality of circuit patterns. In some other embodiments, the substrate main body 112 may have a multilayer structure in which a plurality of base substrates are stacked, and a plurality of circuit patterns for electrical connection between layers may each be formed between two of the plurality of base substrates. The plurality of circuit patterns may be connected to the plurality of conductive pads 114A, 114B, 114C, and 114D exposed on the mounting surface 112A or the back surface 112B of the substrate main body 112 such that the plurality of circuit patterns are electrically connected to the plurality of chips 130 mounted to the printed circuit board 110 and provide a path for transferring an electrical signal. In some embodiments, the plurality of circuit patterns may include a plurality of through electrodes and/or a plurality of wiring layers each extending between two of the plurality of base substrates, the plurality of through electrodes penetrating the base substrates. The plurality of through electrodes and the plurality of wiring layers may include copper (Cu), aluminum (Al), nickel (Ni), stainless steel, or combinations thereof, but embodiments are not limited thereto.

The mounting surface 112A of the printed circuit board 110 has a first region I and a second region II adjacent to the first region I. In some embodiments, the first region I may have a ring-shaped structure surrounding the second region II. The ring-shaped structure may have various planar shapes, e.g., polygons, circles, ellipses, and the like. In some other embodiments, the second region II may be arranged at an edge of the first region I such that the first region I partially surrounds the second region II. Planar shapes of the first region I and the second region II are not particularly limited, and each of the first region I and the second region II may have various planar shapes, as needed.

In the embodiment of FIG. 1, the plurality of conductive pads 114A, 114B, and 114C are exposed on the mounting surface 112A of the substrate main body 112, and the plurality of conductive pads 114D are exposed on the back surface 112B of the substrate main body 112. The plurality of conductive pads 114A, 114B, 114C, and 114D may include the same material as a plurality of wiring layers constituting the substrate main body 112 or may include a metal, e.g., copper (Cu). In some embodiments, surfaces of the plurality of conductive pads 114A, 114B, 114C, and 114D, which are opposite to the substrate main body 112, may be coated with an organic solderability preservative (OSP) surface treatment layer. The OSP surface treatment layer may include Ni, Au, palladium (Pd), silver (Ag), or an alloy thereof, and an imidazole compound or an azole compound.

The insulating protective layer 118 may protect circuit patterns included in the printed circuit board 110 and prevent the occurrence of solder bridges between the circuit patterns. The insulating protective layer 118 may include an insulating coating film such as a solder resist. The solder resist may include photoresist, epoxy, polyimide, polyester, or the like, without being limited thereto.

First chips 132 and 134, which are some of the plurality of chips 130, may be formed over the first region I of the mounting surface 112A. The first chips 132 and 134 may be connected to the plurality of conductive pads 114A among the plurality of conductive pads 114A, 114B, 114C, and 114D through a first connection member 122, the plurality of conductive pads 114A being formed on the first region I of the mounting surface 112A. Although an example, in which two first chips 132 and 134 are mounted over the first region I, is shown in FIG. 1, embodiments are not limited to the example shown in FIG. 1. One first chip or three or more first chips may be mounted over the first region I.

A second chip 136, which is one of the plurality of chips 130, may be formed over the second region II of the mounting surface 112A. The second chip 136 may be connected to a plurality of conductive pads 114B among the plurality of conductive pads 114A, 114B, 114C, and 114D through a second connection member 126, the plurality of conductive pads 114B being formed on the second region 11 of the mounting surface 112A. The second connection member 126 may have a double-layer structure including a lower connection member 126L and an upper connection member 126U are on the conductive pads 114B in this order. The lower connection member 126L and the upper connection member 126U may include the same material. Although an example in which one second chip 136 is mounted over the second region II is shown in FIG. 1, embodiments are not limited thereto. For example, a plurality of second chips for performing different functions may be mounted on the second region II, as needed.

Each of the first connection member 122 and the second connection member 126 may include a conductive solder paste. The conductive solder paste may include a mixture of solder powder and flux, or a formulation of solder powder and epoxy resin. In some embodiments, the solder powder may include tin (Sn), Sn-lead (Pb), Sn—Ag—Cu, Sn—Ag, Sn—Cu, Sn-bismuth (Bi), Sn-zinc (Zn)—Bi, Sn—Ag—Bi, Sn—Ag—Zn, indium (In)—Sn, In—Ag, Sn—Pb—Ag, In—Pb, Sn—Pb—Bi, Sn—Pb—Bi—Ag, or the like, but embodiments are not limited thereto.

The first chips 132 and 134 and the second chip 136 may be chips performing different functions. In some embodiments, each of the first chips 132 and 134 and the second chip 136 may be a controller chip, a non-volatile memory chip, a volatile memory chip, a dummy chip, or a passive device. The non-volatile memory chip may include, for example, NAND flash memory, resistive random access memory (RRAM), magnetoresistive RAM (MRAM), phase-change RAM (PRAM), or ferroelectric RAM (FRAM). The first chips 132 and 134 and the second chip 136 may include a plurality of individual devices of various kinds. The plurality of individual devices may include various microelectronic devices, for example, a metal-oxide-semiconductor field effect transistor (MOSFET), a system large scale integrated circuit (system LSI), an imaging sensor such as a CMOS imaging sensor (CIS), a micro-electro-mechanical system (MEMS), an active device, a passive device, or the like. In some embodiments, the second chip 136 mounted over the second region II may include a controller, non-volatile memory, volatile memory, a sensor module, a display, a camera module, or an audio module. In some embodiments, the second chip 136 may include at least one sensor such as a biosignal sensing sensor, a global positioning sensor (GPS), or the like. For example, the second chip 136 may include a biosignal sensing sensor for detecting at least one of blood pressure, heart rate variability (HRV), heart rate monitor (HRM), photoplethysmograph (PPG), sleep interval, skin temperature, heart rate, blood flow, blood sugar, oxygen saturation, pulse wave, and electrocardiogram (ECG), but embodiments are not limited thereto.

Among the plurality of chips 130, the molding unit 140 may cover the first chips 132 and 134, which are mounted over the first region I, and may not cover the second chip 136, which is mounted over the second region II. The molding unit 140 may include a chip protective molding unit 142, which covers the first chips 132 and 134 over the first region I, and a substrate protective molding unit 144, which extends on the second region II and has a lower thickness than the chip protective molding unit 142.

The chip protective molding unit 142 may protect the first chips 132 and 134 mounted over the first region I. In particular, the chip protective molding unit 142 may completely cover the first chips 132 and 134, other than where these chips are in contact with the first connection members, e.g., may be on an upper surfaces, side surfaces and a bottom surface of the first chips 132 and 134.

The substrate protective molding unit 144 may protect the insulating protective layer 118 on the second region II from light, moisture, external impact, and so forth. The molding unit 140 may have a structure in which the chip protective molding unit 142 and the substrate protective molding unit 144 are connected to each other as one body.

The second connection member 126 may penetrate the substrate protective molding unit 144. The second connection member 126 may connect the second chip 136 to the conductive pads 114B, with the substrate protective molding unit 144 being between the second chip 136 and the conductive pads 114B.

In the second region II, a top surface of the substrate protective molding unit 144 may have a step ST and a recess surface RS1 defined by the step ST. The substrate protective molding unit 144 may include an edge portion 144E, which surrounds the recess surface RS1 and has a top surface covered with the electromagnetic shielding film 150, and a central portion 144C, which is surrounded by the edge portion 144E and has the recess surface RS1. The edge portion 144E may have a thickness that is less than the thickness of the chip protective molding unit 142, and the central portion 144C may have a thickness that is less than the thickness of the edge portion 144E. As used herein, the term "thickness" may refer to a size along a direction (Z direction) perpendicular to an extension direction of the printed circuit board 110.

In the printed circuit board 110, the area occupied by the substrate protective molding unit 144 may be greater than the area occupied by the second chip 136, e.g., in an X-Y plane. The height of the top surface of the substrate protective molding unit 144 may be less than the height of a bottom surface of the second chip 136. As used herein, the term "height" may refer to a distance from the printed circuit board 110 along the direction (Z direction) perpendicular to the extension direction of the printed circuit board 110. The second chip 136 may be vertically spaced apart from the substrate protective molding unit 144. The second chip 136 may be arranged over the recess surface RS1 to vertically overlap the recess surface RS1, e.g., an entirety of the recess surface RS1 in the Z direction. The second chip 136 may extend in the X and/or Y directions to at least partially overlap edge portion 144E in the Z direction, while being spaced therefrom in the Z direction.

In some embodiments, the molding unit 140 may include an epoxy mold compound (EMC). In some embodiments, the molding unit 140 may include a Si-based material, a thermosetting material, a thermoplastic material, a UV curable material, or the like. When the molding unit 140 includes a thermosetting material, the molding unit 140 may include a curing agent and an acrylic polymer additive. The curing agent may include a phenol type, acid anhydride type, or amine type material. In some embodiments, the molding unit 140 may include resin, and may further include a silica filler, as needed. In some embodiments, a portion of the molding unit 140, which is between the first chips 132 and 134 and the printed circuit board 110, may be an underfill layer formed by a capillary underfill method.

The electromagnetic shielding film 150 may conformally cover a surface of the molding unit 140 in the first region I and the second region II. The electromagnetic shielding film 150 may be connected to a conductive pad 114C among the plurality of conductive pads 114A, 114B, 114C, and 114D through a third connection member 128, the conductive pad 114C being formed in the first region I of the mounting surface 112A. The conductive pad 114C may be formed at the farthest position from the second region II among the plurality of conductive pads 114A and 114C formed in the first region I. The conductive pad 114C may be a ground electrode.

An opening 150H is formed in the electromagnetic shielding film 150 such that the second chip 136 mounted over the second region II is exposed outside the electromagnetic shielding film 150. The opening 150H may expose the recess surface RS1 of the substrate protective molding unit 144 in the second region II, e.g. the entirety thereof, and may not extend along a side of the step ST in the Z direction. The second chip 136 may be aligned with the opening 150H of the electromagnetic shielding film 150 and arranged over the recess surface RS1 of the substrate protective molding unit 144. The second chip 136 may be spaced apart from the chip protective molding unit 142 along the Z direction, with the electromagnetic shielding film 150 being between the second chip 136 and the chip protective molding unit 142 at edges thereof adjacent to the recess surface RS1.

The step ST of the substrate protective molding unit 144 may be aligned with an inner sidewall of the opening 150H in the electromagnetic shielding film 150 such that the step ST has a surface continuously connected to a vertical extension line of the inner sidewall the opening 150H. As shown in FIG. 1, a width W1 of the opening 150H may be less than a width W2 of the second chip 136 in a horizontal direction (X direction) that is parallel to the extension direction of the printed circuit board 110. However, this is merely an example, and the width W1 of the opening 150H may be equal to or greater than the width W2 of the second chip 136. When the width W1 of the opening 150H is greater than the width W2 of the second chip 136, a maximum separation distance between the inner sidewall of the opening 150H and the second chip 136 may be about 50 μm or less. A separation distance between the electromagnetic shielding film 150 and the second chip 136 is minimized by minimizing the separation distance between the inner sidewall of the opening 150H and the second chip 136 to about 50 μm or less, thereby improving electromagnetic shielding capabilities of the package and suppressing an increase in size of the package due to the separation distance.

In some embodiments, a planar shape of the recess surface RS1 in the substrate protective molding unit 144 may be defined by the opening 150H of the electromagnetic shielding film 150, and the opening 150H and the recess surface RS1 may have the same planar shape.

The electromagnetic shielding film 150 includes a first shielding portion 150A, which conformally covers a top surface and sidewalls of the chip protective molding unit 142 on the first region I, and a second shielding portion 150B, which covers the top surface of the substrate protective molding unit 144 on the second region II around the second chip 136. The second shielding portion 150B may horizontally extend parallel to the extension direction of the printed circuit board 110 from the first shielding portion 150A toward the second chip 136. The height of a top surface of the second shielding portion 150B may be less than the height of a bottom surface of the second chip 136 that faces the second shielding portion 150B. Further, the height of a top surface of the first shielding portion 150A may be less than the height of a top surface of the second chip 136 such that the second chip protrudes above the electromagnetic shielding film 150, while partially overlaps the electromagnetic shielding film 150 in all three directions.

The second chip 136 may be connected to the conductive pads 114B in the second region II of the mounting surface 112A through the second connection member 126. The second connection member 126 may extend from a top side of the molding unit 140 to the conductive pads 114B by penetrating the substrate protective molding unit 144.

In some embodiments, the electromagnetic shielding film 150 may include a material capable of reacting by absorbing a laser beam, e.g., an infrared (IR) laser beam having a wavelength of 1064 nm or a green laser beam having a wavelength of 532 nm. In some embodiments, the electromagnetic shielding film 150 may include a polymer-containing conductive material. For example, the electromagnetic shielding film 150 may include a metal, a conductive metal-polymer composite, or a metal paste. For example, the electromagnetic shielding film 150 may be a conductive metal-polymer composite, e.g., polyurethane with Ag particles. In some other embodiments, the electromagnetic shielding film 150 may include a single layer or multiple layers. For example, the electromagnetic shielding film 150 may have a multilayer structure in which a bonding layer, a conductive material layer, and a protective layer are stacked in this stated order. The bonding layer may include Ni, Cu, titanium (Ti), chromium (Cr), stainless steel, or combinations thereof. The conductive material layer may include Cu, Ag, or combinations thereof. The protective layer may include Ni or stainless steel.

Figure 2:
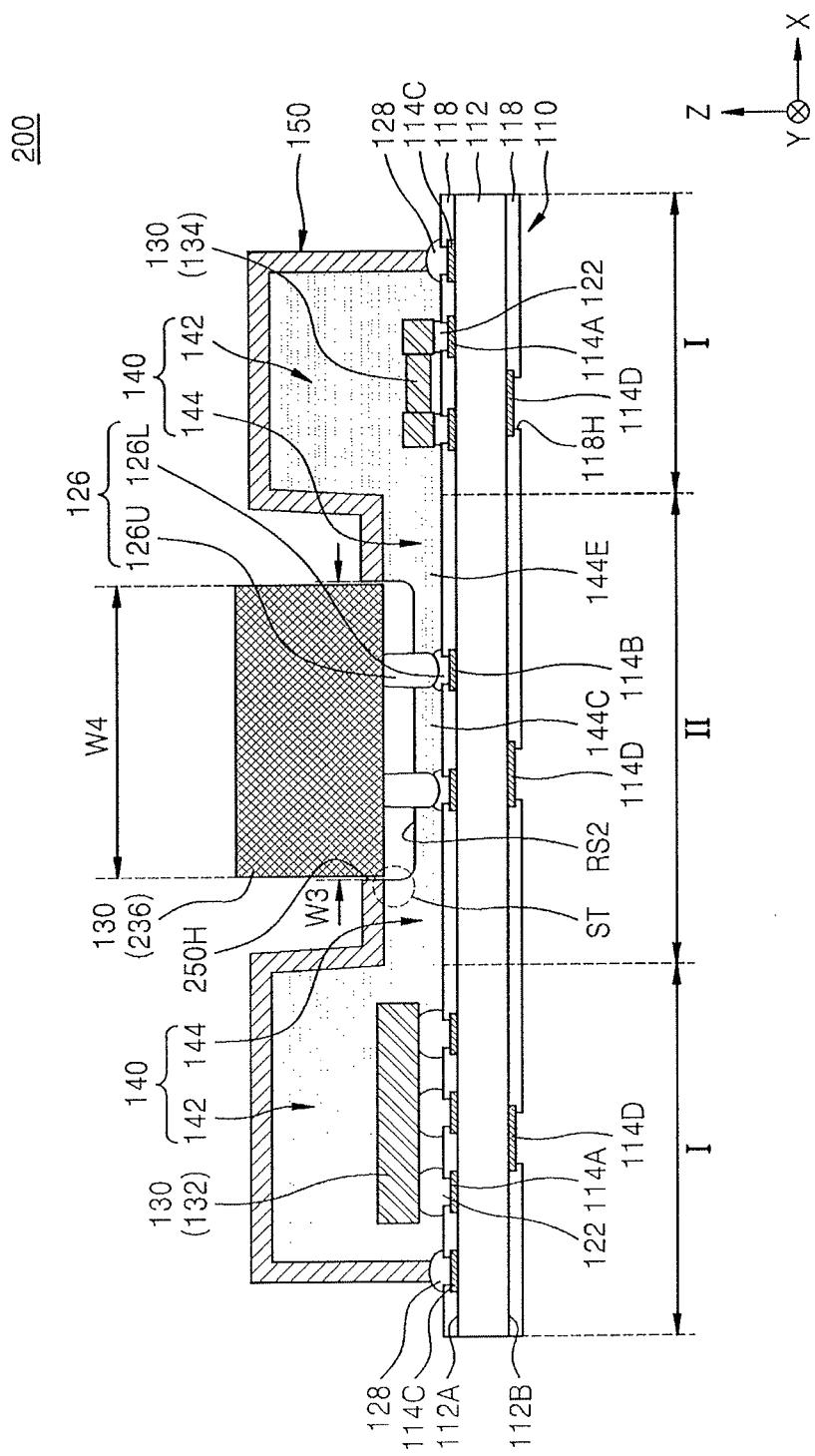
FIG. 2 illustrates a cross-sectional view of an integrated circuit package according to other embodiments.

FIG. 2 is a cross-sectional view of an integrated circuit package according to other embodiments. In FIG. 2, the same reference numerals as in FIG. 1 denote the same members, and descriptions thereof will be omitted.

Referring to FIG. 2, an integrated circuit package 200 has a configuration that is substantially the same as that of the integrated circuit package 100 shown in FIG. 1. However, in the integrated circuit package 200, the top surface of the substrate protective molding unit 144 may have a recess surface RS2 defined by the step ST, a second chip 236 mounted over the second region II among the plurality of chips 130 may be inserted into an opening 250H of the electromagnetic shielding film 150 and arranged over the recess surface RS2 of the substrate protective molding unit 144. A width W3 of the opening 250H may be greater than a width W4 of the second chip 236 in the horizontal direction (X direction) that is parallel to the extension direction of the printed circuit board 110. In other words, the second chip 236 and the electromagnetic shielding film 150 overlap in the X direction, e.g., the second chip 236 may overlap an entire sidewall of the electromagnetic shielding film 150 in the opening 250H, but not in the Z direction.

Here, a separation distance between the electromagnetic shielding film 150 and the second chip 236 is minimized by minimizing the separation distance between an inner sidewall of the opening 250H and the second chip 236 to about 50 μm or less, thereby improving electromagnetic shielding capabilities of the package and suppressing an increase in size of the package due to the separation distance. Details of the second chip 236 are the same as the details of the second chip 136 described with reference to FIG. 1.

Figure 3:
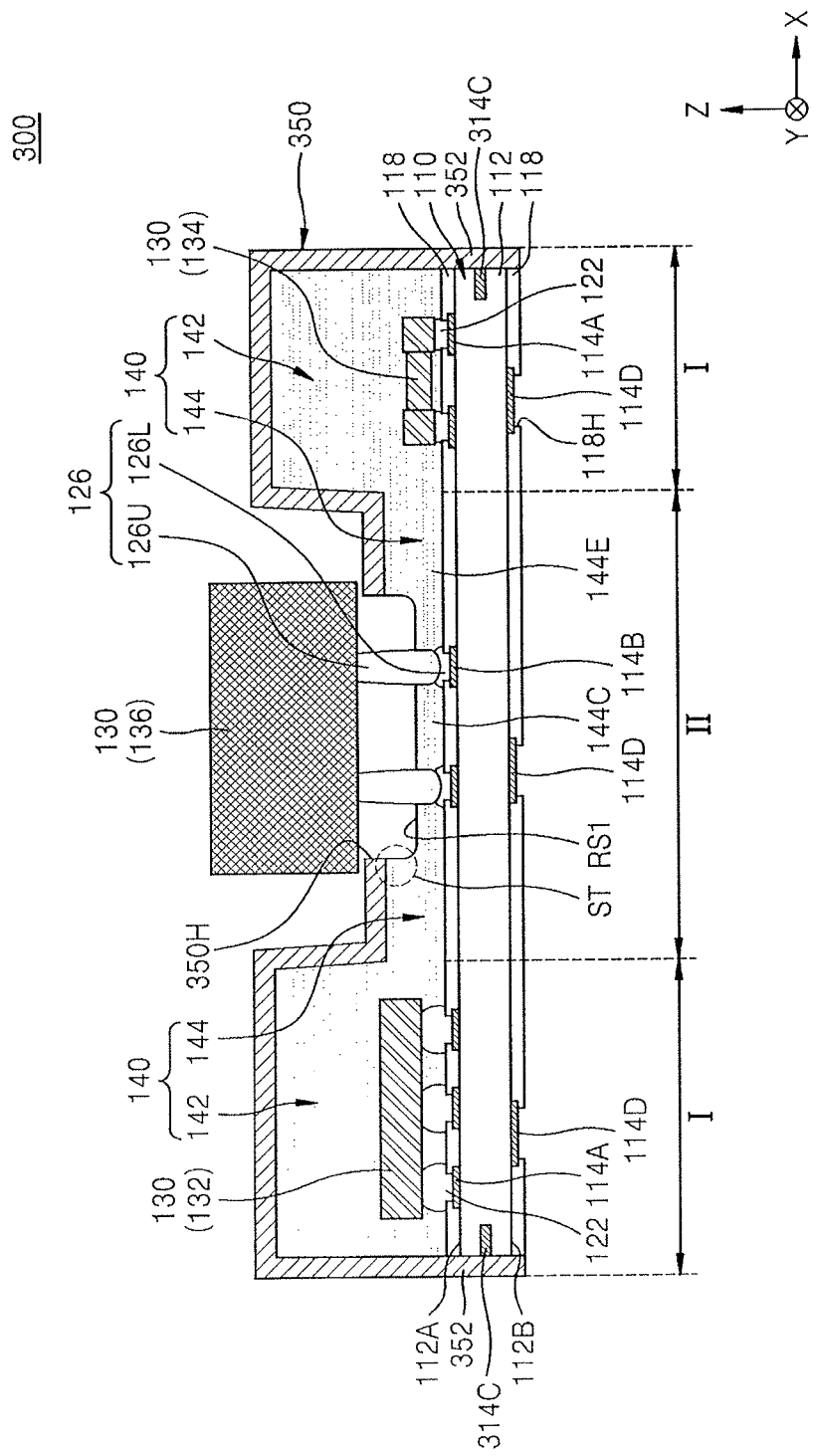
FIG. 3 illustrates a cross-sectional view of an integrated circuit package according to further embodiments.

FIG. 3 is a cross-sectional view of an integrated circuit package according to further embodiments. In FIG. 3, the same reference numerals as in FIG. 1 denote the same members, and descriptions thereof will be omitted.

Referring to FIG. 3, an integrated circuit package 300 has a configuration that is substantially the same as that of the integrated circuit package 100 shown in FIG. 1. However, in the integrated circuit package 300, the printed circuit board 110 includes a ground electrode 314C, which is separated from the mounting surface 112A of the substrate main body 112 and is at least partially buried in the substrate main body 112. The ground electrode 314C may be exposed outside a side surface of the printed circuit board 110. In addition, an electromagnetic shielding film 350 includes an opening 350H, which exposes the recess surface RS1, and a substrate shielding portion 352, which extends to cover the side surface of the printed circuit board 110. The substrate shielding portion 352 has an inner surface contacting the ground electrode 314C, which is exposed at the side surface of the printed circuit board 110. Details of the electromagnetic shielding film 350 are substantially the same as the details of the electromagnetic shielding film 150 described with reference to FIG. 1.

Figure 4:
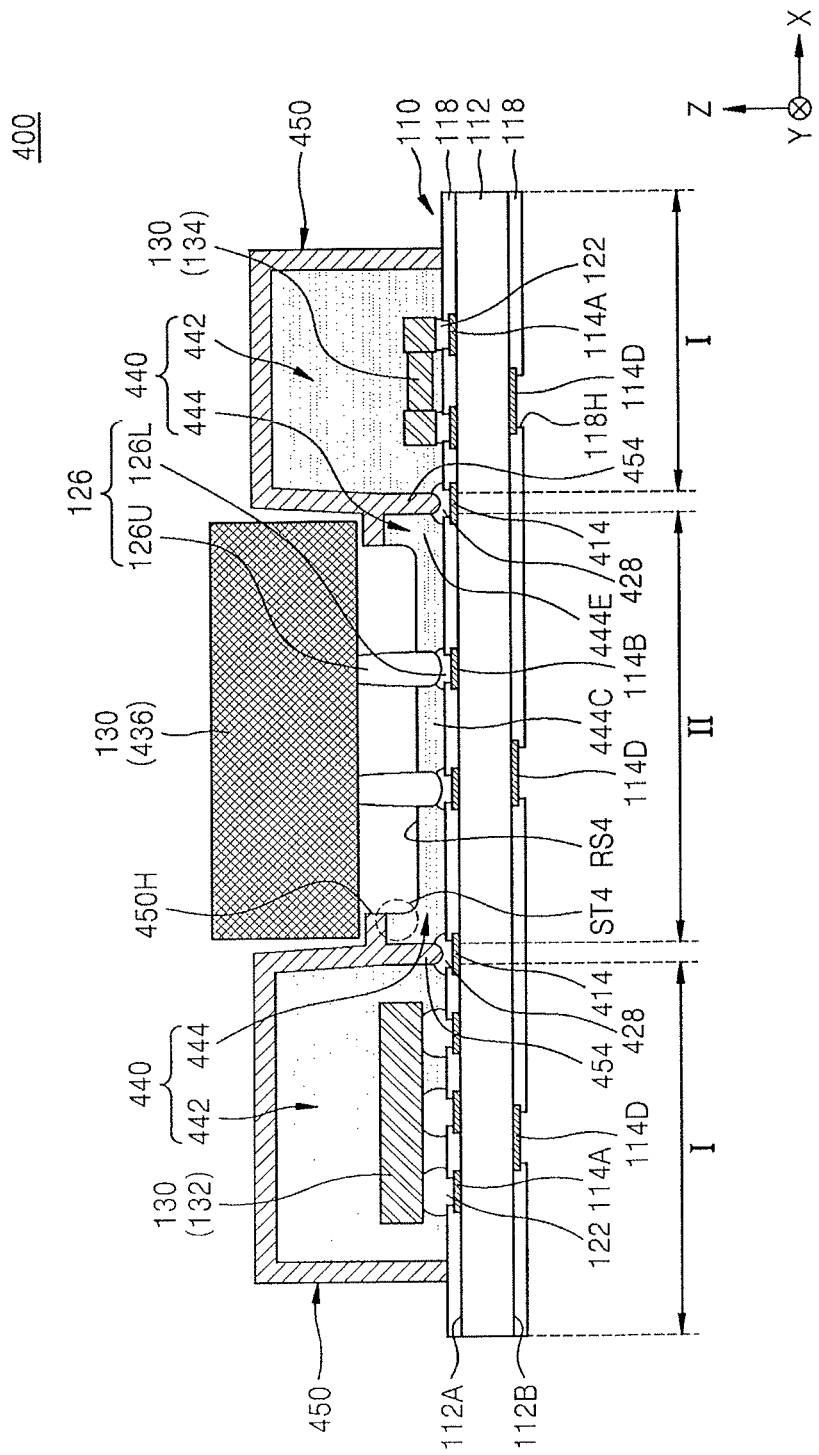
FIG. 4 illustrates a cross-sectional view of an integrated circuit package according to yet other embodiments.

FIG. 4 is a cross-sectional view of an integrated circuit package according to yet other embodiments. In FIG. 4, the same reference numerals as in FIG. 1 denote the same members, and descriptions thereof will be omitted.

Referring to FIG. 4, an integrated circuit package 400 has a configuration that is substantially the same as that of the integrated circuit package 100 shown in FIG. 1. However, in the integrated circuit package 400, the printed circuit board 110 includes a plurality of conductive pads 114A, 114B, 114D, and 414. A conductive pad 414 among the plurality of plurality of conductive pads 114A, 114B, 114D, and 414 may be exposed outside the printed circuit board 110 between the first region I and the second region II of the mounting surface 112A of the substrate main body 112.

Similarly to the molding unit 140 shown in FIG. 1, a molding unit 440 includes a chip protective molding unit 442, which covers the first chips 132 and 134 over the first region I of the mounting surface 112A, and a substrate protective molding unit 444, which extends on the second region II and has a lower thickness than the chip protective molding unit 442. However, the chip protective molding unit 442 and the substrate protective molding unit 444 are spaced apart from each other, with a shielding space 440S (see FIG. 7B) being between the chip protective molding unit 442 and the substrate protective molding unit 444, the shielding space 440S being between the first region I and the second region II. The shielding space 440S is filled with an electromagnetic shielding film 450. In addition, a top surface of the substrate protective molding unit 444 may have a step ST4 and a recess surface RS4 defined by the step ST4. Thus, the substrate protective molding unit 444 may include an edge portion 444E surrounding the recess surface RS4 and having a top surface and a sidewall, which are covered with the electromagnetic shielding film 450, and a central portion 444C surrounded by the edge portion 444E and having the recess surface RS4. The edge portion 444E may have a thickness that is less than the thickness of the chip protective molding unit 442, and the central portion 444C may have a thickness that is less than the thickness of the edge portion 444E.

Figure 7B:
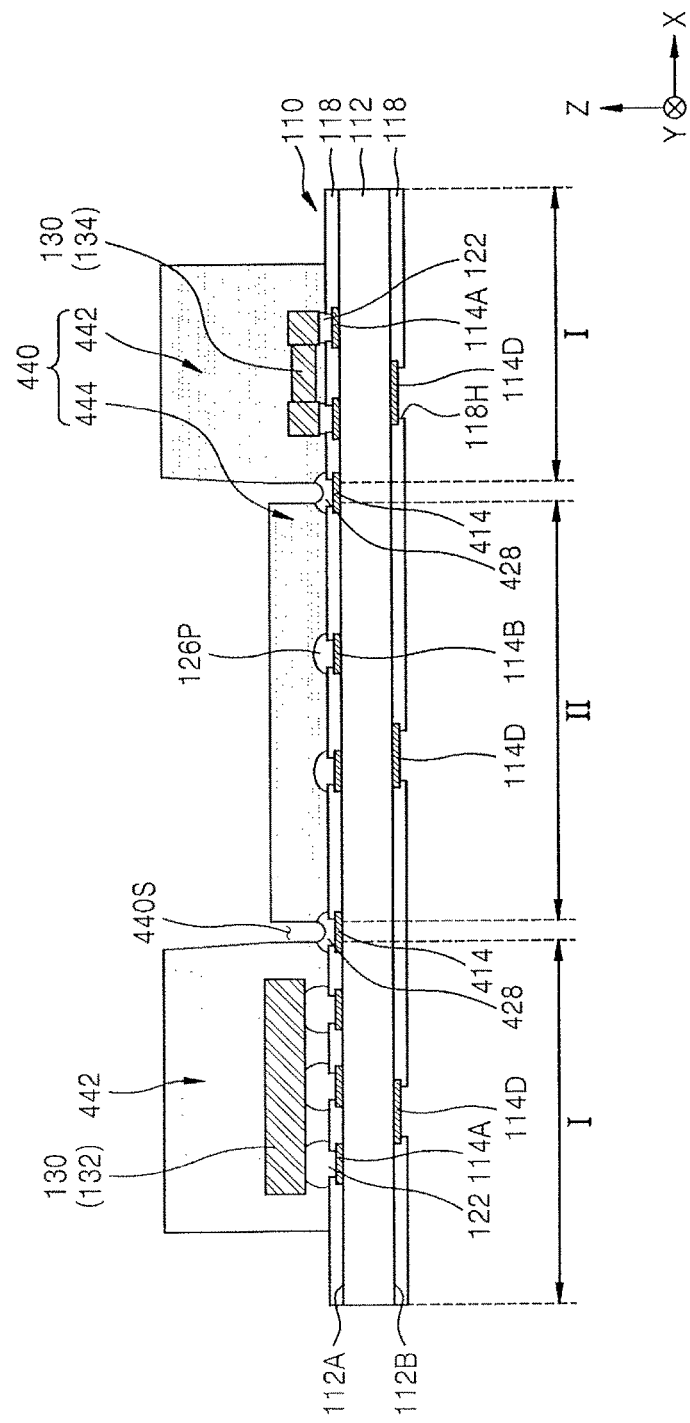

The electromagnetic shielding film 450 may extend between the chip protective molding unit 442 and the substrate protective molding unit 444 to cover a sidewall of the chip protective molding unit 442 and a sidewall of the substrate protective molding unit 444, in the shielding space 440S (see FIG. 7B). A sidewall shielding portion 454 may be electrically connected to the conductive pad 414 through a connection member 428. The conductive pad 414 may be a ground electrode.

Details of the conductive pad 414, the connection member 428, the molding unit 440, and the electromagnetic shielding film 450 are substantially the same as the details of the conductive pads 114A, 114B, 114C, and 114D, the first connection member 122, the molding unit 140, and the electromagnetic shielding film 150, which have been described with reference to FIG. 1.

A second chip 436 mounted over the second region II among the plurality of chips 130 may be arranged over the recess surface RS4 of the substrate protective molding unit 444, at a position at which the second chip 436 vertically overlaps the opening 450H in the electromagnetic shielding film 450. Details of the second chip 436 is mostly the same as the details of the second chip 136 described with reference to FIG. 1.

FIGS. 5A to 5G are cross-sectional views illustrating stages in a method of fabricating an integrated circuit package, according to embodiments. A method of fabricating the integrated circuit package 100 shown in FIG. 1 will be described with reference to FIGS. 5A to 5G. In FIGS. 5A to 5G, the same reference numerals as in FIG. 1 denote the same members, and descriptions thereof will be omitted.

Figure 5A:
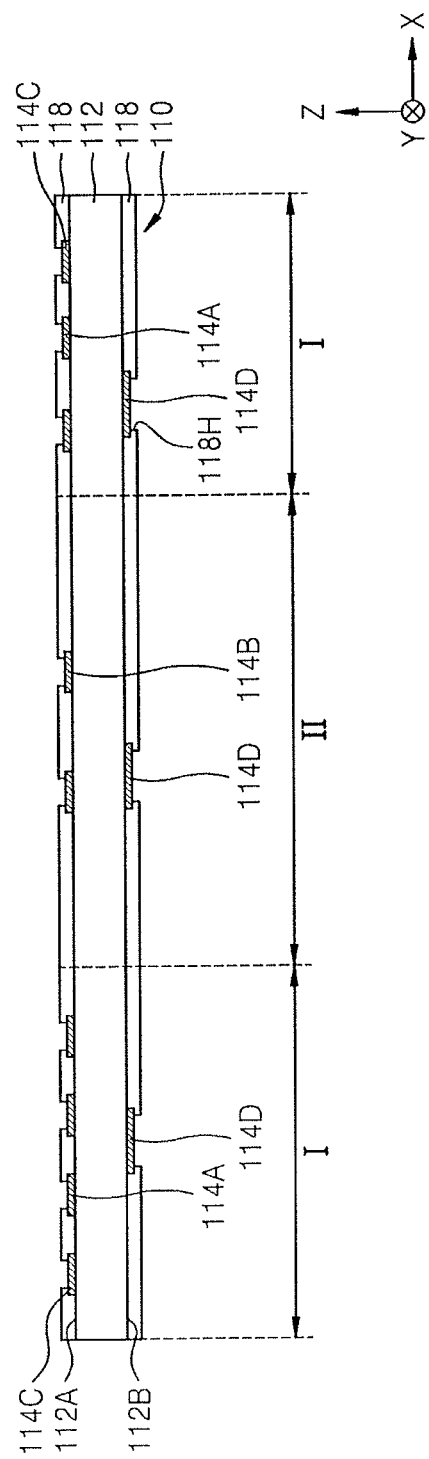
FIGS. 5A to 5G illustrate cross-sectional views of stages in a method of fabricating an integrated circuit package, according to embodiments.

Referring to FIG. 5A, the printed circuit board 110 is prepared. To prepare the printed circuit board 110, the plurality of conductive pads 114A, 114B, 114C, and 114D may be formed on the mounting surface 112A and the back surface 112B of the substrate main body 112, followed by forming the insulating protective layer 118, which covers the mounting surface 112A and the back surface 112B of the substrate main body 112 such that the plurality of conductive pads 114A, 114B, 114C, and 114D are exposed, the substrate main body 112 having a single layer structure, which includes a single base substrate including a plurality of circuit patterns (not shown), or a multilayer structure, in which a plurality of base substrates are stacked.

The conductive pad 114C may be a ground electrode, to which the electromagnetic shielding film 150 is connected in a subsequent process. In some embodiments, at least one conductive pad 114C may be formed on both sides of the printed circuit board 110. In some other embodiments, the conductive pad 114C may include one line pattern extending in a ring shape along an outer edge of the first region I.

Figure 5B:
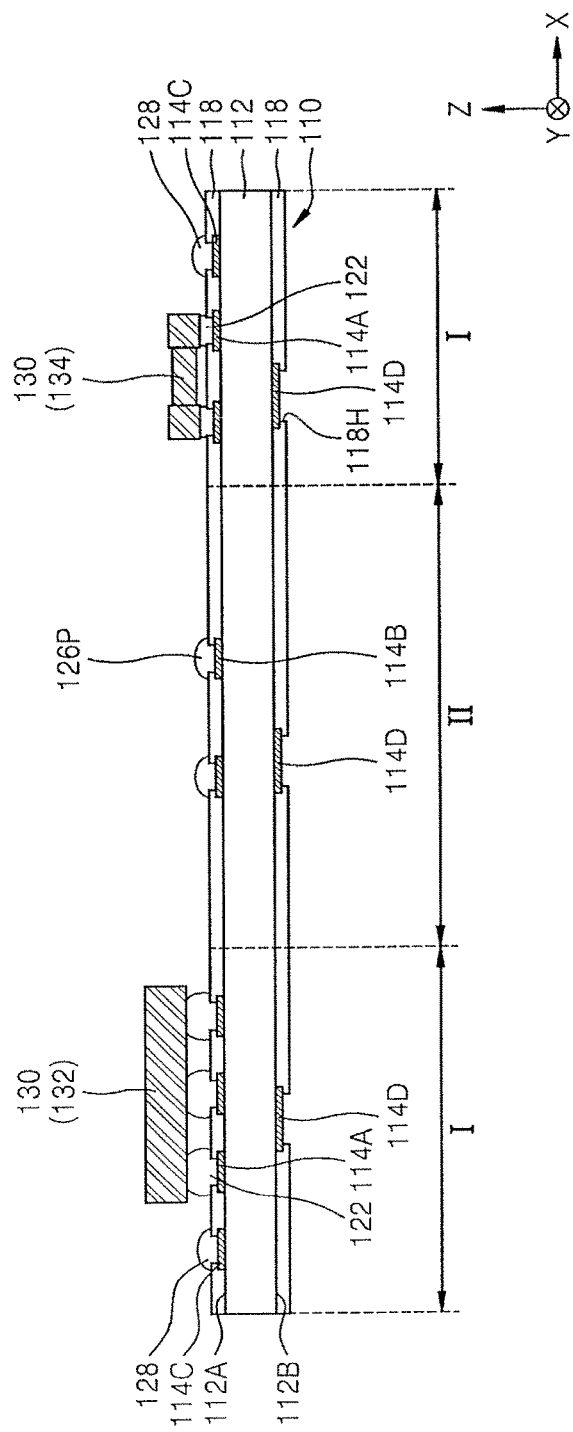

Referring to FIG. 5B, a solder paste is supplied onto the plurality of conductive pads 114A, 114B, and 114C exposed on the mounting surface 112A of the substrate main body 112, thereby forming a plurality of connection members 122, 126P, and 128. The plurality of connection members 122, 126P, and 128 may include: the first connection member 122 formed on the plurality of conductive pads 114A on the first region I of the mounting surface 112A; the third connection member 128 formed on the conductive pad 114C that is at an edge of the first region I of the mounting surface 112A, the edge of the first region I being far from the second area II; and a preliminary second connection member 126P formed on the plurality of conductive pads 114B on the second region II of the mounting surface 112A.

Next, while the third connection member 128 and the preliminary second connection member 126P are exposed, the first chips 132 and 134 are mounted over the first region I. The first chips 132 and 134 may be connected to the plurality of conductive pads 114A through the first connection member 122. While the first chips 132 and 134 are mounted, the plurality of conductive pads 114B and 114C are protected by the preliminary second connection member 126P and the third connection member 128. Since the plurality of conductive pads 114B and 114C may be protected from vibration, impact, moisture, external contamination, and the like, the plurality of conductive pads 114B and 114C may be prevented from being damaged or deteriorated and may maintain reliability.

In some embodiments, although a solder jet method may be used to form the plurality of connection members 122, 126P, and 128, embodiments are not limited thereto. For example, to form the plurality of connection members 122, 126P, and 128, an electrolytic plating, electroless plating, vacuum deposition, printing, solder ball transfer, or stud bumping method may be used.

Figure 5C:
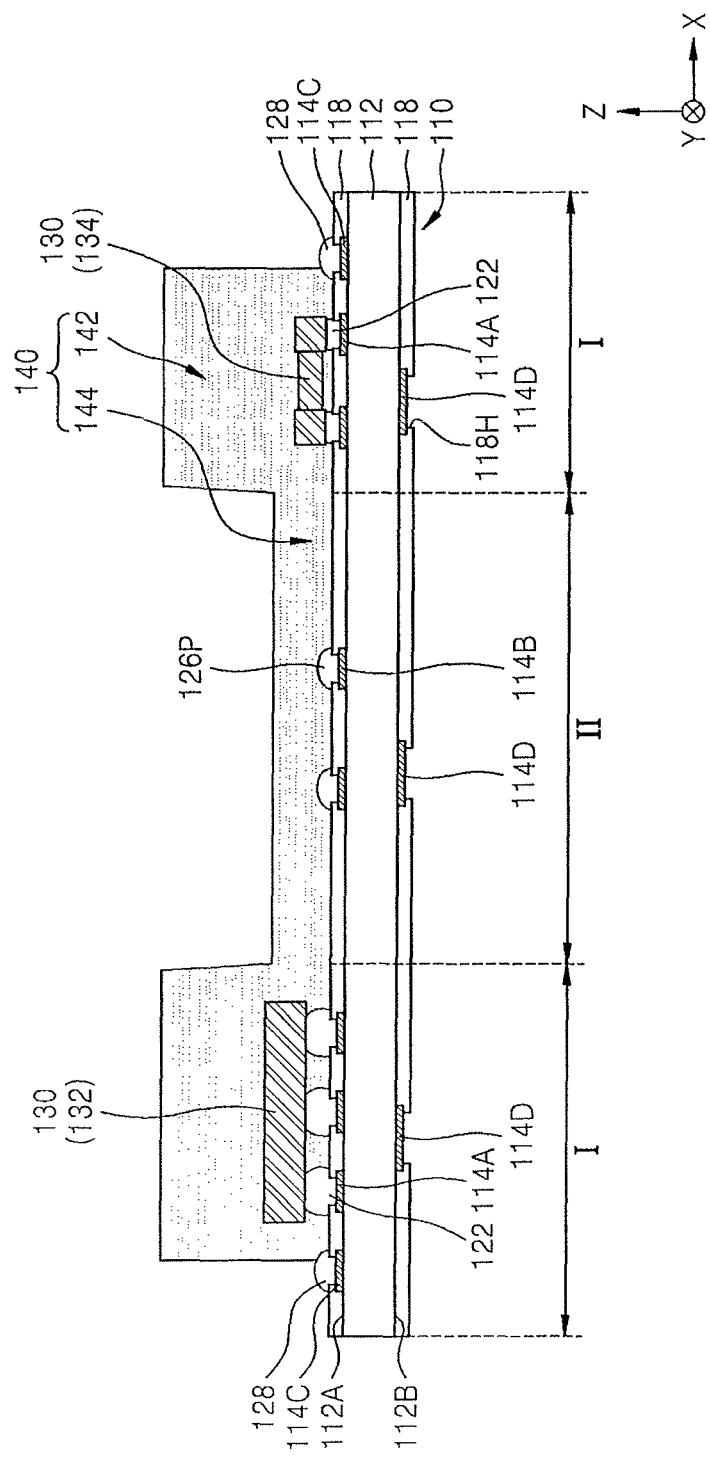

Referring to FIG. 5C, the molding unit 140 is formed to cover the first region I and the second region II of the mounting surface 112A. The molding unit 140 may include the chip protective molding unit 142, which covers the first chips 132 and 134 on the first region I, and the substrate protective molding unit 144, which extends on the second region II and has a lower thickness than the chip protective molding unit 142. The third connection member 128 covering the conductive pad 114C around the molding unit 140 may be exposed.

In some embodiments, to form the molding unit 140, a mold providing a space having the same shape as the molding unit 140 may be used. In some other embodiments, a preliminary molding unit, which has a uniform thickness and covers the first region I and the second region II, is formed, followed by removing the preliminary molding unit from a top surface thereof as much as a certain thickness by using a laser such that the preliminary molding unit only on the second region II is recessed as much as the certain thickness, thereby forming the molding unit 140 having a shape shown in FIG. 5C.

Figure 5D:
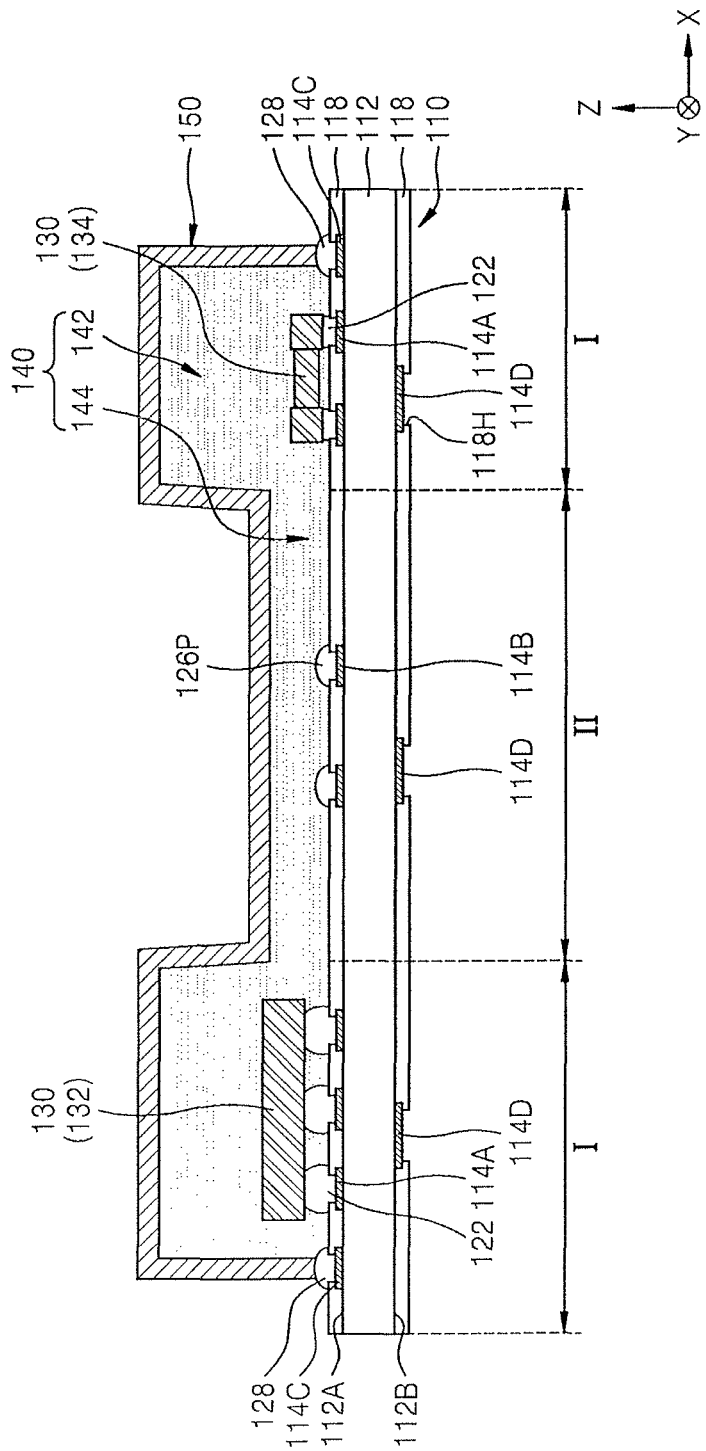

Referring to FIG. 5D, the electromagnetic shielding film 150 is formed and covers an exposed surface of the molding unit 140 on the printed circuit board 110. The electromagnetic shielding film 150 may contact the third connection member 128 covering the conductive pad 114.

In some embodiments, forming the electromagnetic shielding film 150 may include covering a portion of the printed circuit board 110, which is around the molding unit 140 and is not to have the electromagnetic shielding film 150 formed thereon, with a mask pattern, such that the electromagnetic shielding film 150 may be formed only on the exposed surface of the molding unit 140. To form the electromagnetic shielding film 150, a spray or sputtering process may be used. In some embodiments, the electromagnetic shielding film 150 may have a thickness of about 5 μm to about 20 μm, without being limited thereto.

Figure 5E:
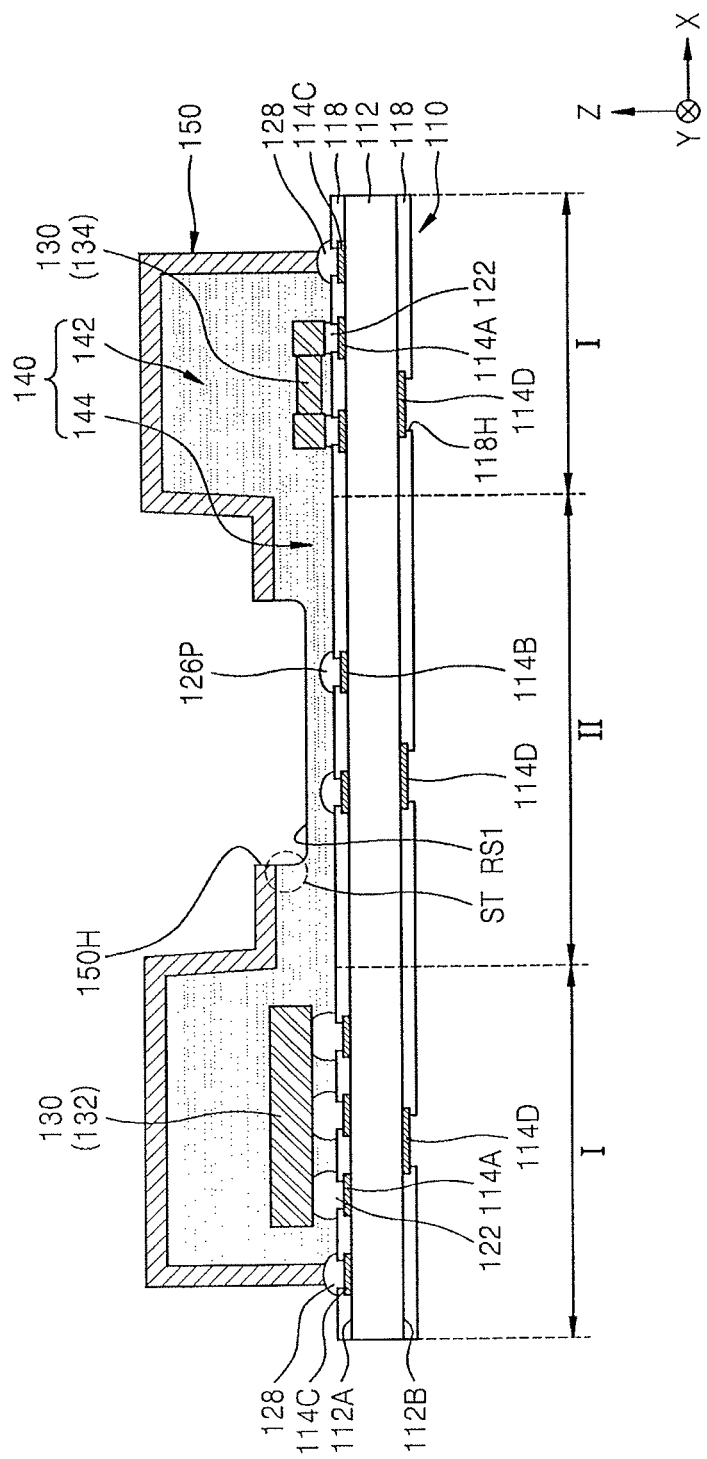

Referring to FIG. 5E, on the second region II, the opening 150H is formed by partially removing the electromagnetic shielding film 150, and the substrate protective molding unit 144, which is exposed by the opening 150H due to the partial removal of the electromagnetic shielding film 150, is removed from the top surface thereof as much as a certain thickness, thereby forming the step ST and the recess surface RS1 on the top surface of the substrate protective molding unit 144, the recess surface RS1 being defined by the step ST. The substrate protective molding unit 144 remaining after forming the recess surface RS1 may protect the insulating protective layer 118 on the second region II from light, moisture, or external impact.

The process of forming the step ST and the recess surface RS1 may be consecutively performed in situ after the process of forming the opening 150H of the electromagnetic shielding film 150. In some embodiments, the electromagnetic shielding film 150 may be etched by using a laser, and the substrate protective molding unit 144 may be partially removed by over-etch of the electromagnetic shielding film 150 by using the laser, thereby forming the recess surface RS1. In some embodiments, an IR laser or a green light laser may be used as the laser, but embodiments are not limited thereto.

Figure 5F:
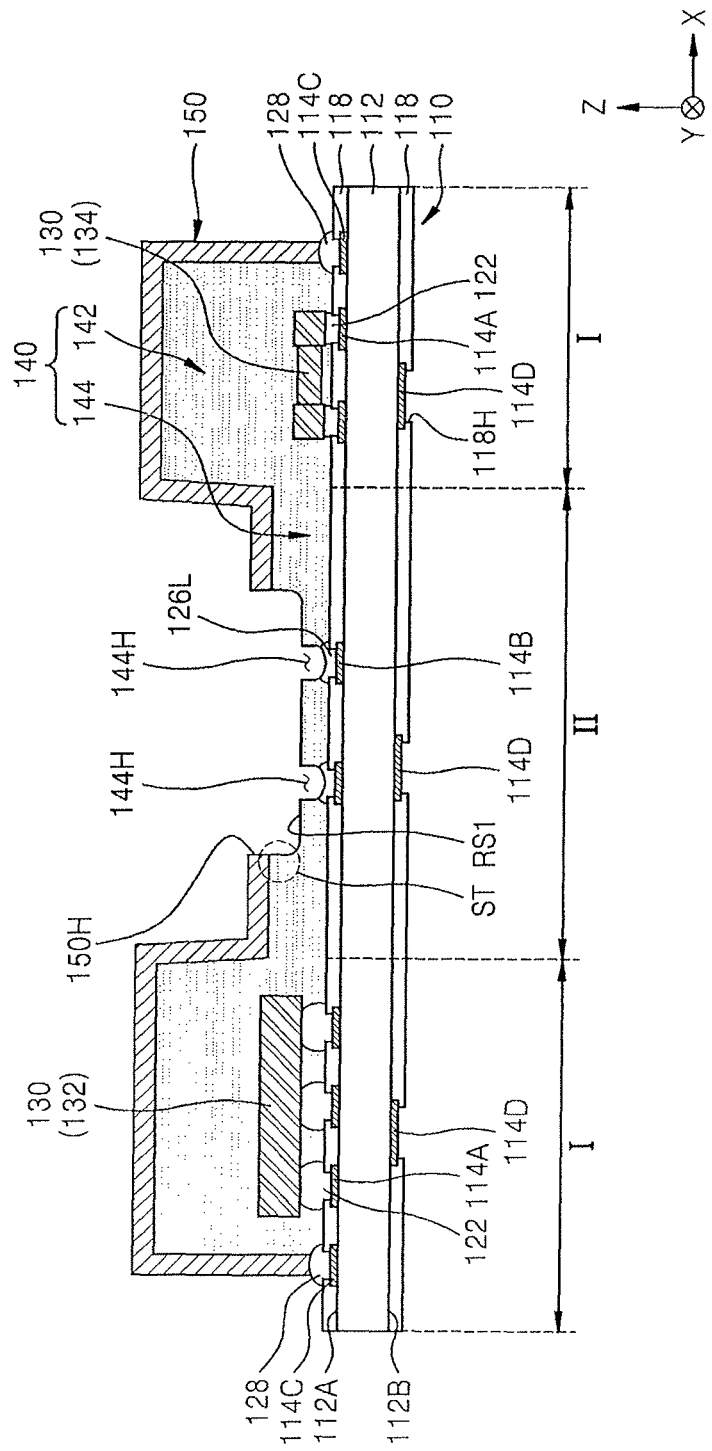

Referring to FIG. 5F, some areas selected from the recess surface RS1 of the substrate protective molding unit 144 on the second region II are removed, thereby forming a plurality of connection holes 144H, which expose the preliminary second connection member 126P covering the plurality of conductive pads 114B. The process of forming the plurality of connection holes 144H may be consecutively performed in situ after the process of forming the step ST and the recess surface RS1 of the substrate protective molding unit 144. To form the plurality of connection holes 144H, some portions of the substrate protective molding unit 144 may be removed by using a laser. A laser application process for forming the plurality of connection holes 144H may be consecutively performed after a laser application process for forming the recess surface RS1. Although an IR laser or a green light laser may be used as a laser for forming the plurality of connection holes 144H, embodiments are not limited thereto. During the formation of the plurality of connection holes 144H, the preliminary second connection member 126P, which is exposed by the plurality of connection holes 144H, may be partially etched by the laser and changed in shape, thereby remaining as a lower connection member 126L.

Figure 5G:
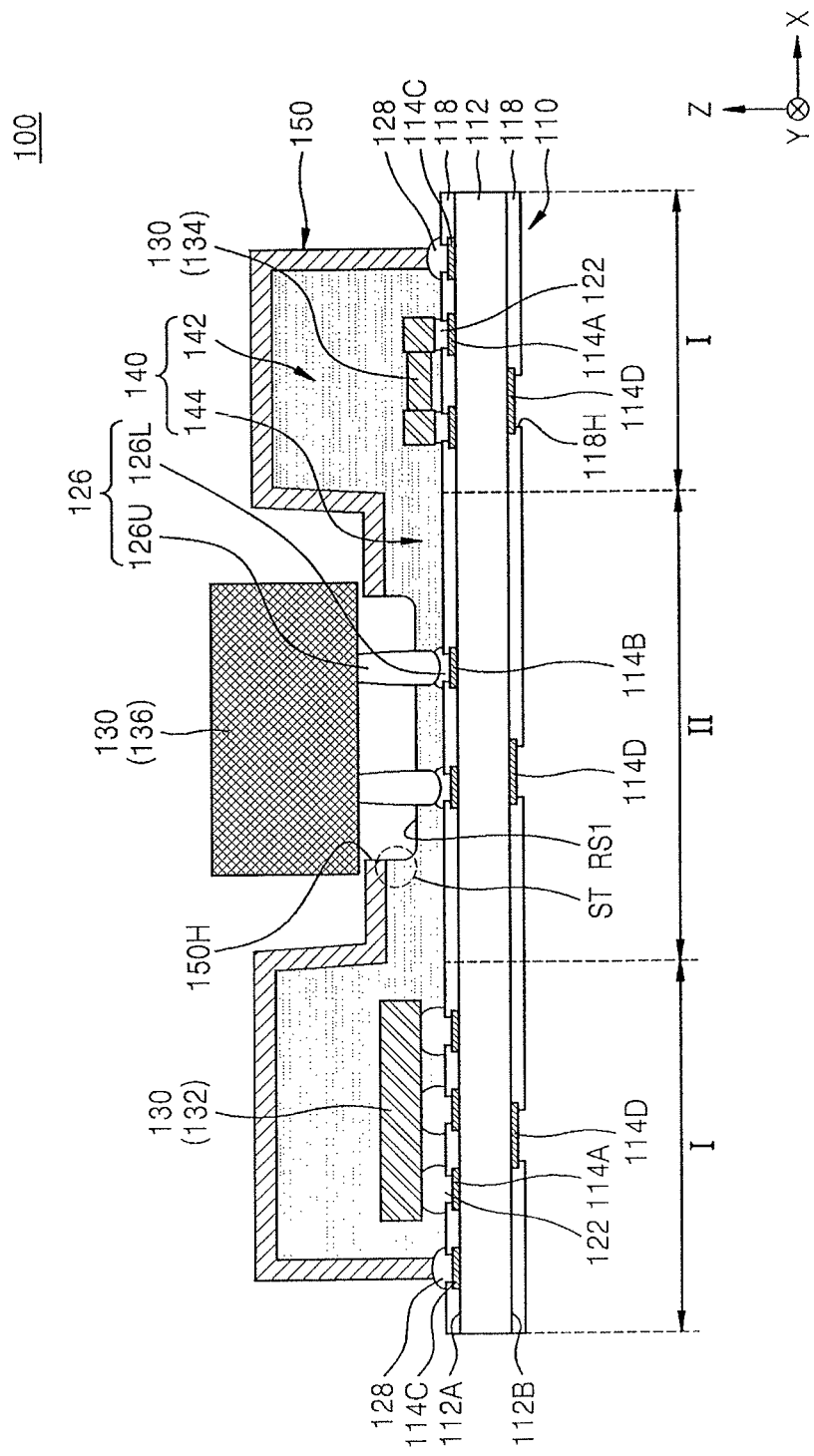

Referring to FIG. 5G, in the resultant product of FIG. 5F, the second connection member 126 having a double-layer structure is formed by forming an upper connection member 126U, which penetrates the plurality of connection holes 144H and contacts the lower connection member 126L, followed by mounting the second chip 136 over the second region II via the second connection member 126, thereby fabricating the integrated circuit package 100 shown in FIG. 1.

The second chip 136 may be vertically spaced apart from the recess surface RS1 of the substrate protective molding unit 144, at a position at which the second chip 136 vertically overlaps the recess surface RS1.

The integrated circuit package 200 shown in FIG. 2 may be fabricated by using the method of fabricating the integrated circuit package, the method having been described with reference to FIGS. 5A to 5G. In some embodiments, to fabricate the integrated circuit package 200 shown in FIG. 2, in the process described with reference to FIG. 5E, instead of forming the opening 150H by partially removing the electromagnetic shielding film 150, the opening 250H may be formed by taking into account the size of the second chip 236 that is to be mounted over the second region II. Next, the substrate protective molding unit 144, which is exposed by the opening 250H for which the size is determined as set forth above, may be removed from the top surface thereof as much as a certain thickness, thereby forming the step ST and the recess surface RS2 on the top surface of the substrate protective molding unit 144, the recess surface RS2 being defined by the step ST. Next, processes similar to the processes of FIGS. 5F and 5G may be performed, thereby fabricating the integrated circuit package 200 shown in FIG. 2.

FIGS. 6A to 6E are cross-sectional views illustrating stages in a method of fabricating an integrated circuit package, according to other embodiments. A method of fabricating the integrated circuit package 300 shown in FIG. 3 will be described with reference to FIGS. 6A to 6E. In FIGS. 6A to 6E, the same reference numerals as in FIGS. 1 to 5G denote the same members, and descriptions thereof will be omitted.

Figure 6A:
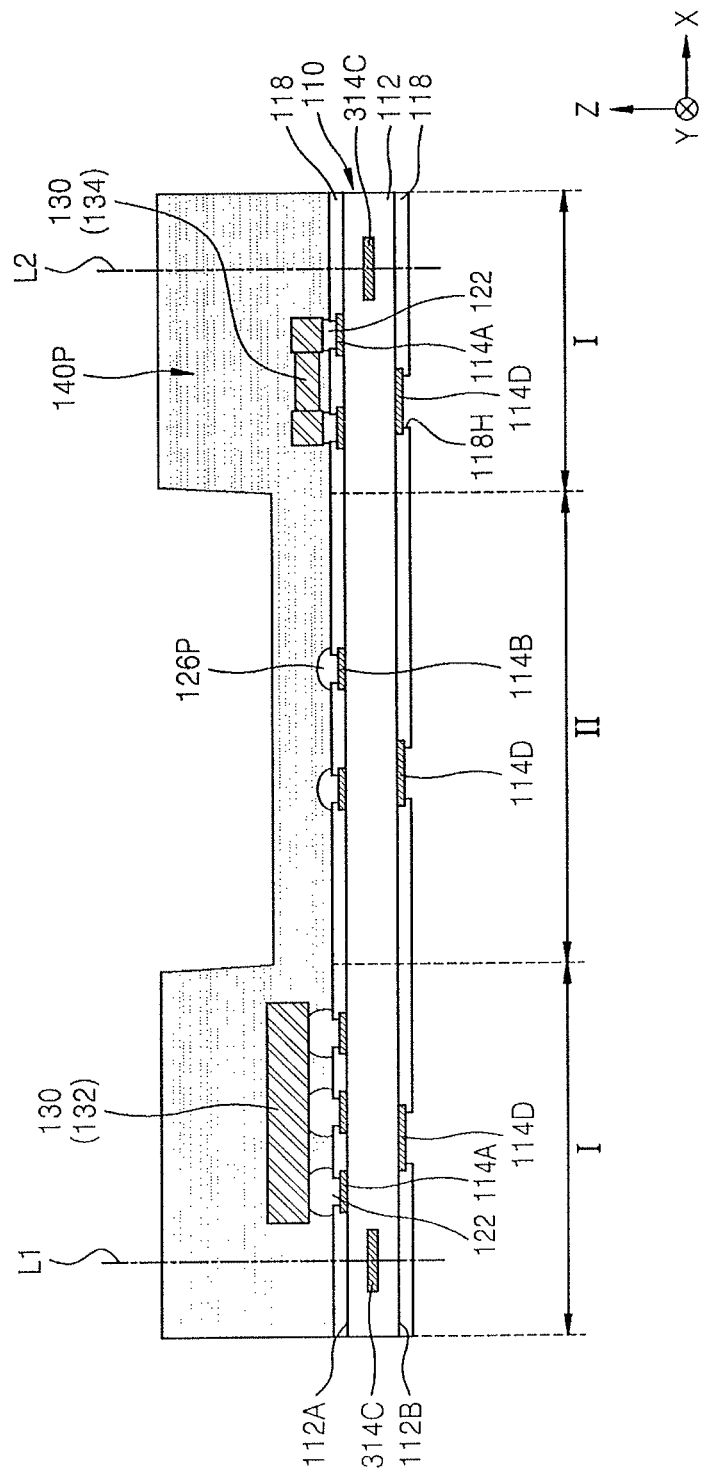
FIGS. 6A to 6E illustrate cross-sectional views of stages in a method of fabricating an integrated circuit package, according to other embodiments.

Referring to FIG. 6A, the printed circuit board 110 is prepared in a similar method to the method described with reference to FIG. 5A. However, in this example, unlike in the example shown in FIGS. 5A to 5G, the printed circuit board 110 does not include the conductive pad 114C and the third connection member 128, which are formed on the first region I of the mounting surface 112A, and includes the ground electrode 314C formed inside the substrate main body 112 and separated from the mounting surface 112A. Next, the plurality of connection members 122 and 126P are formed on the printed circuit board 110 in the same method as described with reference to FIG. 5B.

The electromagnetic shielding film 350 (see FIG. 6C) may be connected to the ground electrode 314C in a subsequent process. In some embodiments, at least one ground electrode 314C may be formed on both sides of the printed circuit board 110. In some other embodiments, the ground electrode 314C may include one line pattern extending in a ring shape along an outer edge of the first region I.

Next, in a similar method to the method described with reference to FIG. 5C, a preliminary molding unit 140P is formed and covers the first region I and the second region II of the mounting surface 112A. The preliminary molding unit 140P may be cut along dash-dotted lines L1 and L2 shown in FIG. 6A in a subsequent process, thereby performing separation into individual packages. In some embodiments, instead of forming the preliminary molding unit 140P, as shown in FIG. 6A, the molding unit 140 shown in FIG. 5C may be formed. In this case, the process of performing separation into individual packages may be omitted, the process having been described above.

Figure 6B:
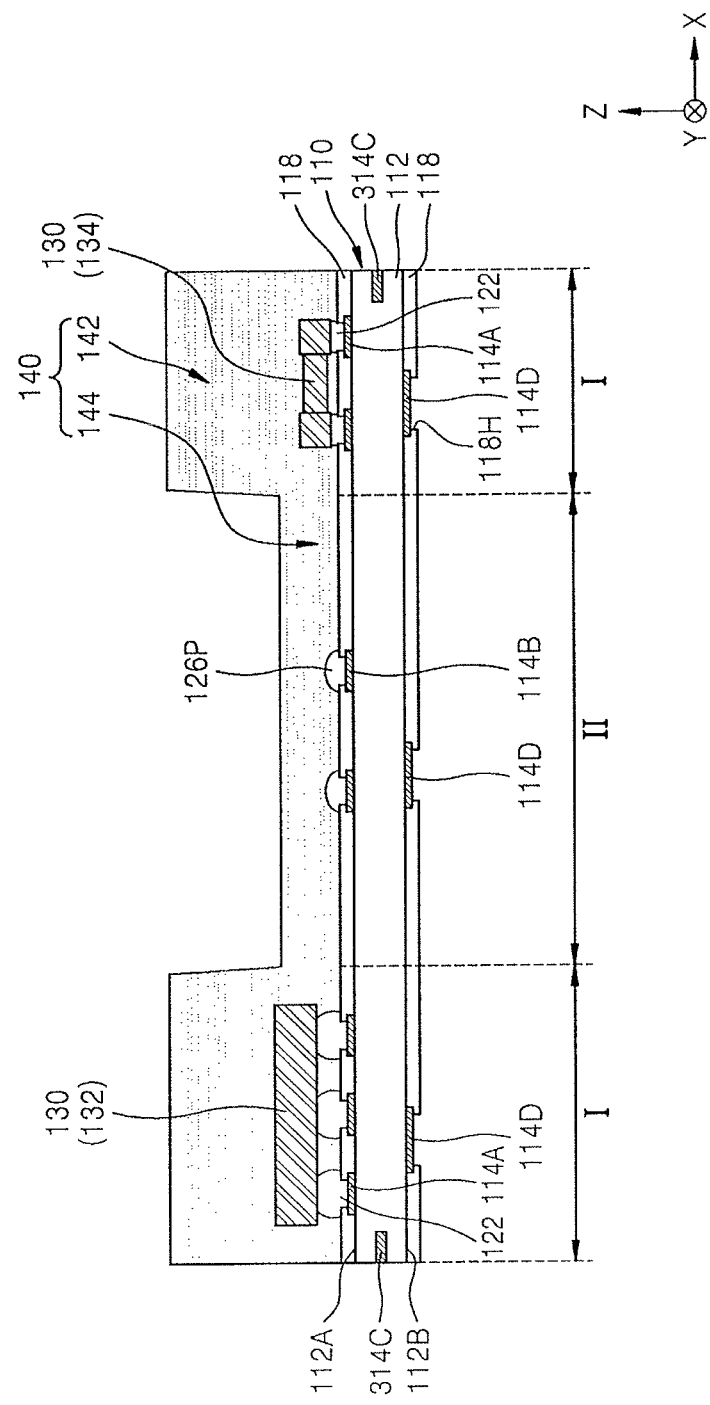

FIG. 6B shows a resultant product in which the ground electrode 314C is exposed outside side surfaces of the printed circuit board 110 after the resultant product of FIG. 6A is cut along the dash-dotted lines L1 and L2. As shown in FIG. 6B, as a result of cutting the result product of FIG. 6A along the dash-dotted lines L1 and L2, the molding unit 140 including the chip protective molding unit 142 and the substrate protective molding unit 144 may remain on the printed circuit board 110.

Figure 6C:
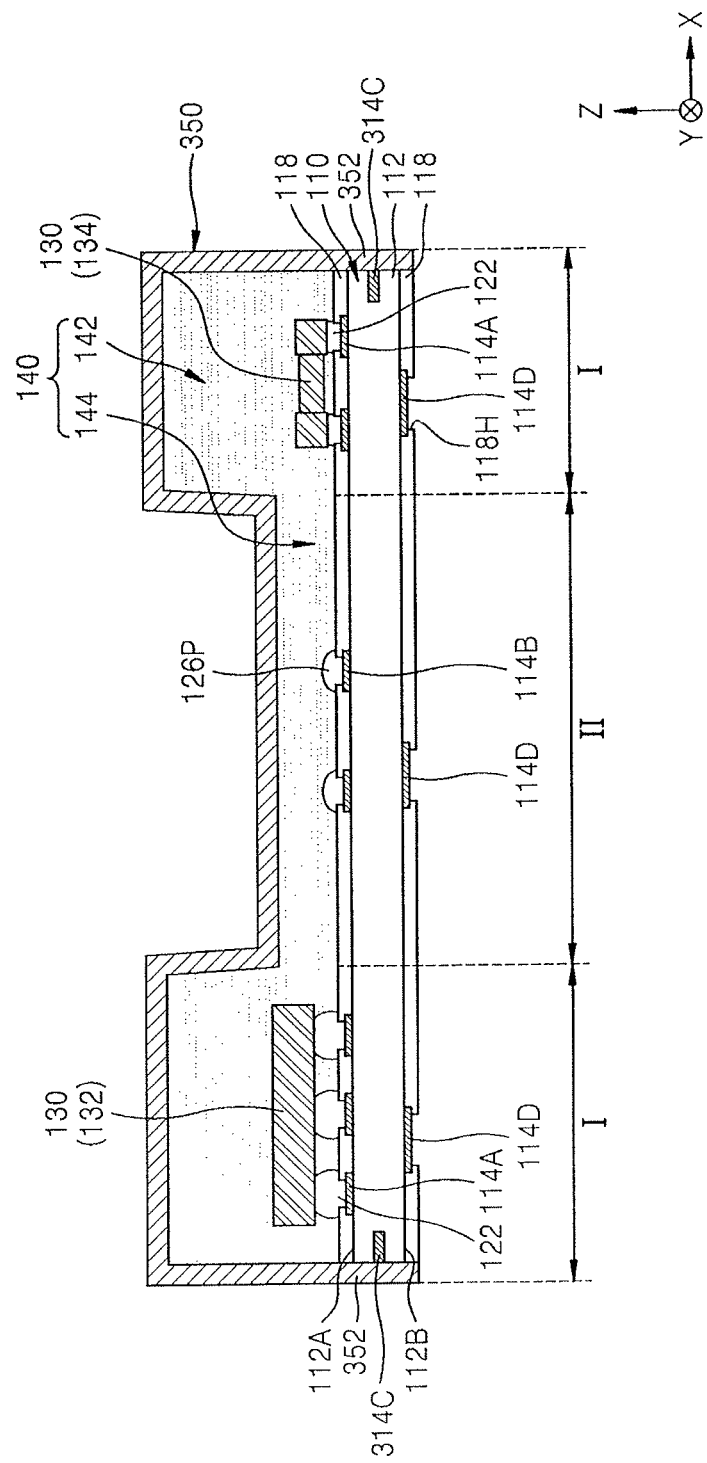

Referring to FIG. 6C, in a similar method to the method described with reference to FIG. 5D, the electromagnetic shielding film 350 is formed and covers exposed surfaces of the molding unit 140 on the printed circuit board 110. The electromagnetic shielding film 350 may include the substrate shielding portion 352, which covers the side surfaces of the printed circuit board 110. The substrate shielding portion 352 may completely cover sidewalls of the printed circuit board and may extend past the back surface 112B of the substrate 112 in the Z direction.

Figure 6D:
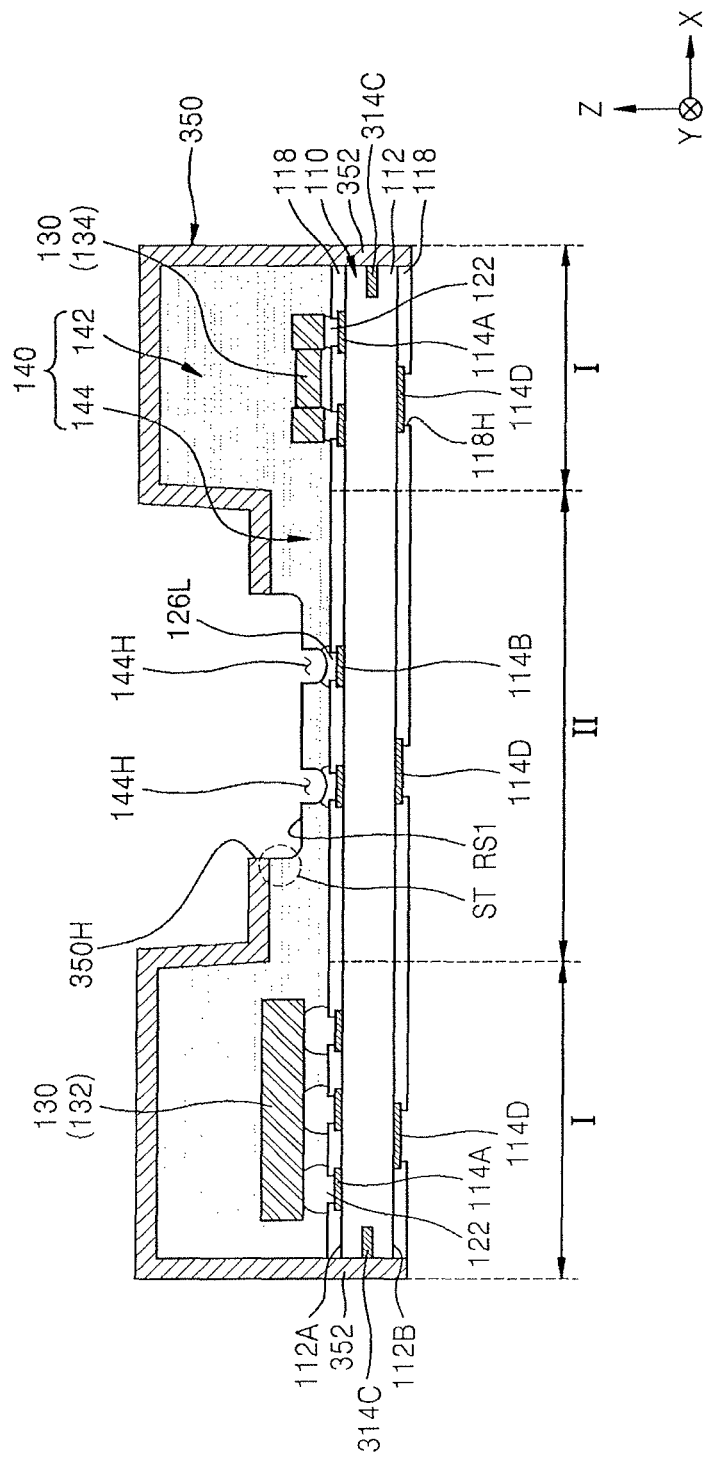

Referring to FIG. 6D, in similar methods to the methods described with reference to FIGS. 5E and 5F, the opening 350H is formed by partially removing the electromagnetic shielding film 350 over the second region II, and the substrate protective molding unit 144 exposed as a result is removed from the top surface thereof as much as a certain thickness, thereby forming the step ST and the recess surface RS1 on the top surface of the substrate protective molding unit 144, the recess surface RS1 being defined by the step ST. Next, the connection holes 144H are formed by removing some areas selected from the recess surface RS1 of the substrate protective molding unit 144 on the second region II, thereby exposing the lower connection member 126L at bottom surfaces of the connection holes 144H.

Figure 6E:
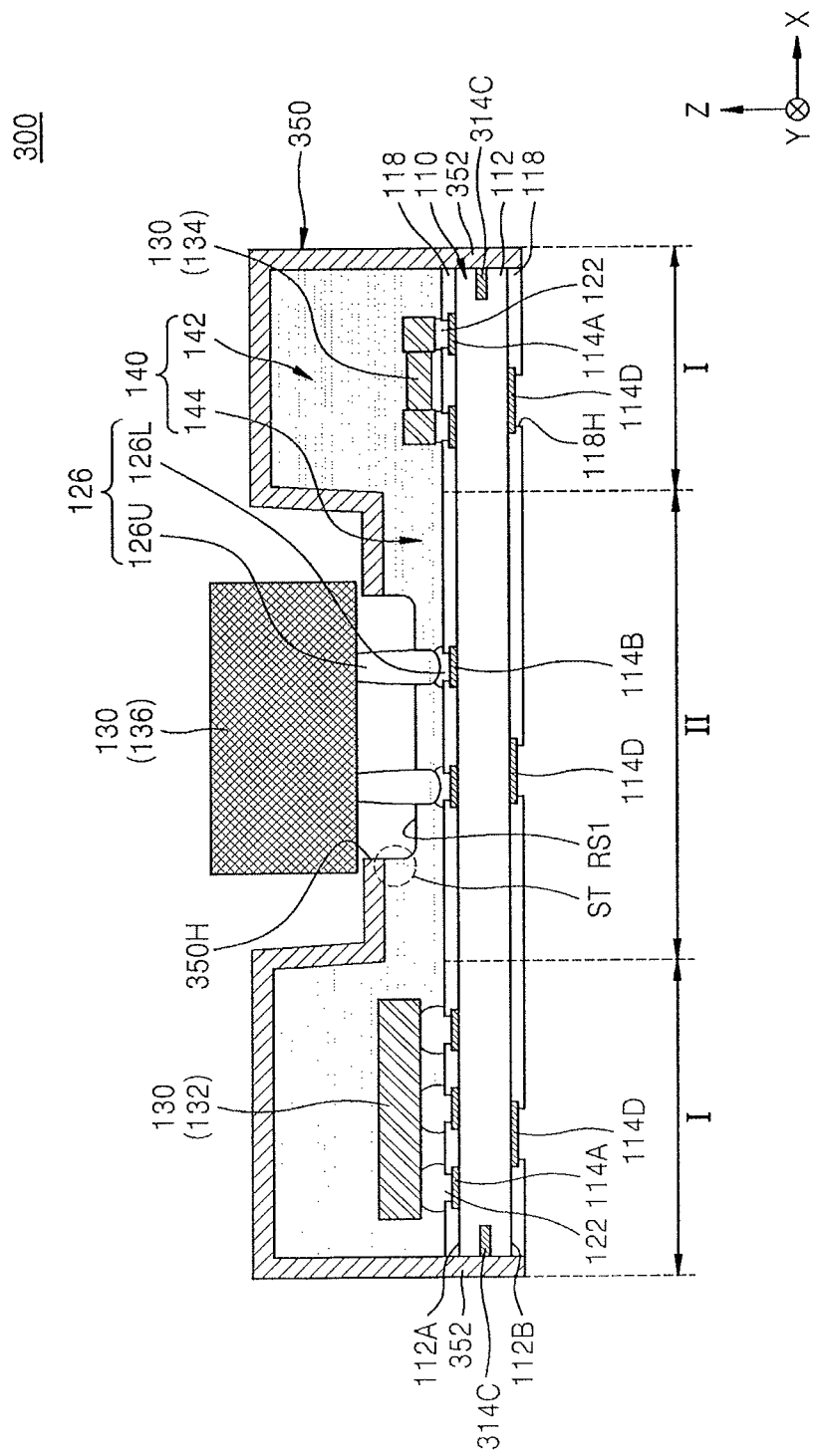

Referring to FIG. 6E, in a similar method to the method described with reference to FIG. 5G, the second connection member 126 having a double-layer structure is formed by forming the upper connection member 126U, followed by mounting the second chip 136 over the second region II via the second connection member 126, thereby fabricating the integrated circuit package 300 shown in FIG. 3.

FIGS. 7A to 7E are cross-sectional views illustrating stages in a method of fabricating an integrated circuit package, according to further embodiments. A method of fabricating the integrated circuit package 400 shown in FIG. 4 will be described with reference to FIGS. 7A to 7E. In FIGS. 7A to 7E, the same reference numerals as in FIGS. 1 to 6E denote the same members, and descriptions thereof will be omitted.

Referring to FIG. 7A, the printed circuit board 110 is prepared in a similar method to the method described with reference to FIG. 5A, followed by forming a plurality of connection members 122, 126P, and 428 on the printed circuit board 110 in a similar method to the method described with reference to FIG. 5B. In this example, unlike in the example shown in FIGS. 5A to 5G, the printed circuit board 110 does not include the conductive pad 114C and the third connection member 128 in the first region I of the mounting surface 112A, but includes the conductive pad 414 exposed outside the printed circuit board 110 between the first region I and the second region II of the mounting surface 112A of the substrate main body 112, and the connection member 428 covering the conductive pad 414.

The conductive pad 414 may be a ground electrode, to which the electromagnetic shielding film 450 (see FIG. 7C) is connected in a subsequent process. In some embodiments, one conductive pad 414 may be formed on both sides of the second region II of the printed circuit board 110. In some other embodiments, the conductive pad 414 may include one line pattern extending in a ring shape along an outer edge of the second region II.

Next, while the preliminary second connection member 126P on the second region II is exposed, the first chips 132 and 134 are mounted on the first region I. The first chips 132 and 134 may be connected to the plurality of conductive pads 114A through the first connection member 122. While the first chips 132 and 134 are mounted, the plurality of conductive pads 114B and 414 are protected by the preliminary second connection member 126P and the connection member 428. Since the plurality of conductive pads 114B and 414 may be protected from vibration, impact, moisture, external contamination, and the like, the plurality of conductive pads 114B and 414 may be prevented from being damaged or deteriorated and may maintain reliability.

Referring to FIG. 7B, in a similar method to formation of the molding unit 140, which has been described with reference to FIG. 5C, the molding unit 440 is formed and covers the first region I and the second region II of the mounting surface 112A. However, the molding unit 440 includes the chip protective molding unit 442, which covers the first chips 132 and 134 on the first region I of the mounting surface 112A, and the substrate protective molding unit 444, which extends on the second region II and has a lower thickness than the chip protective molding unit 442, and the chip protective molding unit 442 and the substrate protective molding unit 444 are spaced apart from each other, with the shielding space 440S being between the chip protective molding unit 442 and the substrate protective molding unit 444, the shielding space 440S being between the first region I and the second region II.

In some embodiments, to form the molding unit 440, the molding unit 140 (see FIG. 5C) is formed on the printed circuit board 110 in a similar method to the method described with reference to FIG. 5C, followed by partially removing the molding unit 140 between the first region I and the second region II by using a laser, whereby the chip protective molding unit 442 and the substrate protective molding unit 444 may be formed simultaneously with forming the shielding space 440S, which exposes the connection member 428, the chip protective molding unit 442 and the substrate protective molding unit 444 being spaced apart from each other, with the shielding space 440S being between the chip protective molding unit 442 and the substrate protective molding unit 444.

Although an IR laser or a green light laser may be used as the laser used for forming the shielding space 440S, embodiments are not limited thereto. During the formation of the shielding space 440S, an upper portion of the connection member 428 may be etched by the laser.

Figure 7C:
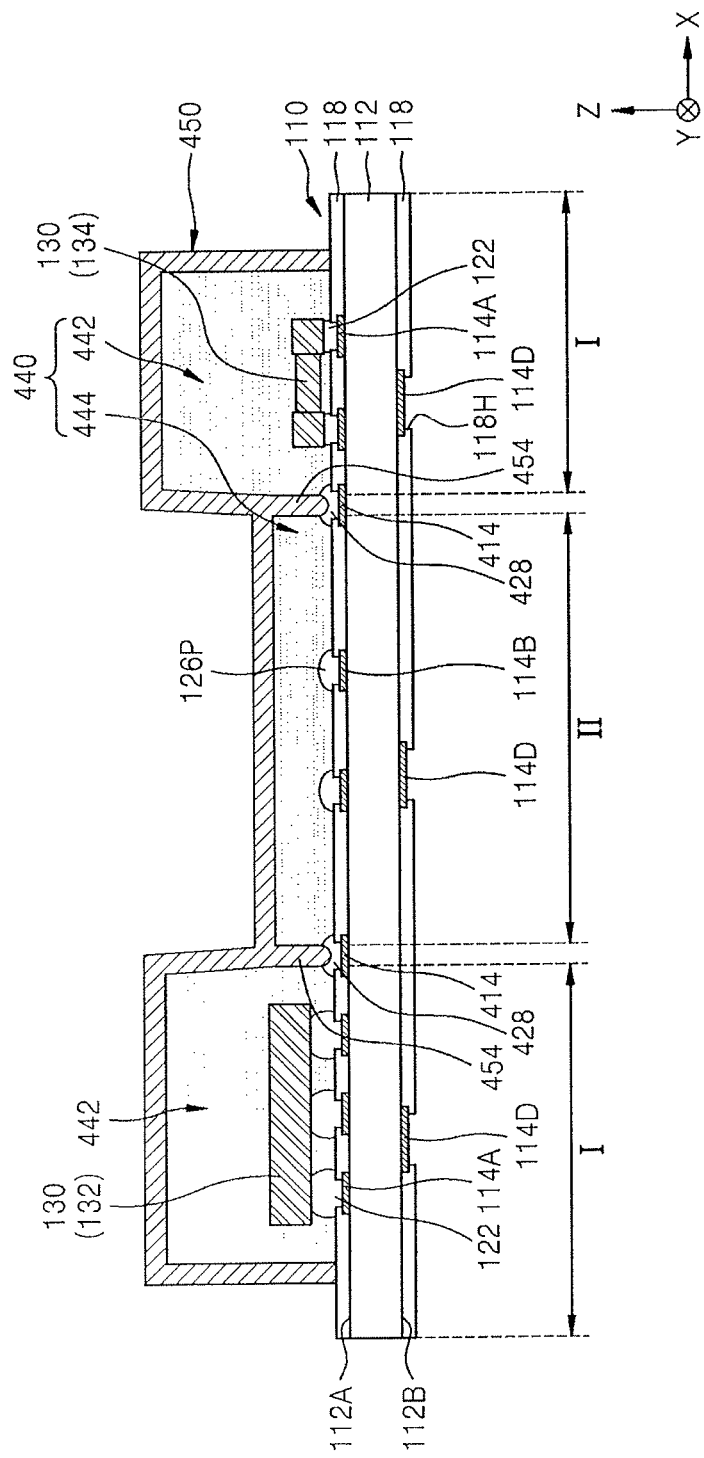

Referring to FIG. 7C, in a similar method to the formation method of the electromagnetic shielding film 150, which has been described with reference to FIG. 5D, the electromagnetic shielding film 450 is formed and covers exposed surfaces of the molding unit 440 on the printed circuit board 110.

The electromagnetic shielding film 450 may include the sidewall shielding portion 454, which extends toward the printed circuit board 110 in the shielding space 440S between the chip protective molding unit 442 and the substrate protective molding unit 444 and is connected to the connection member 428. The sidewall shielding portion 454 may be electrically connected to the conductive pad 414 through the connection member 428.

Figure 7D:
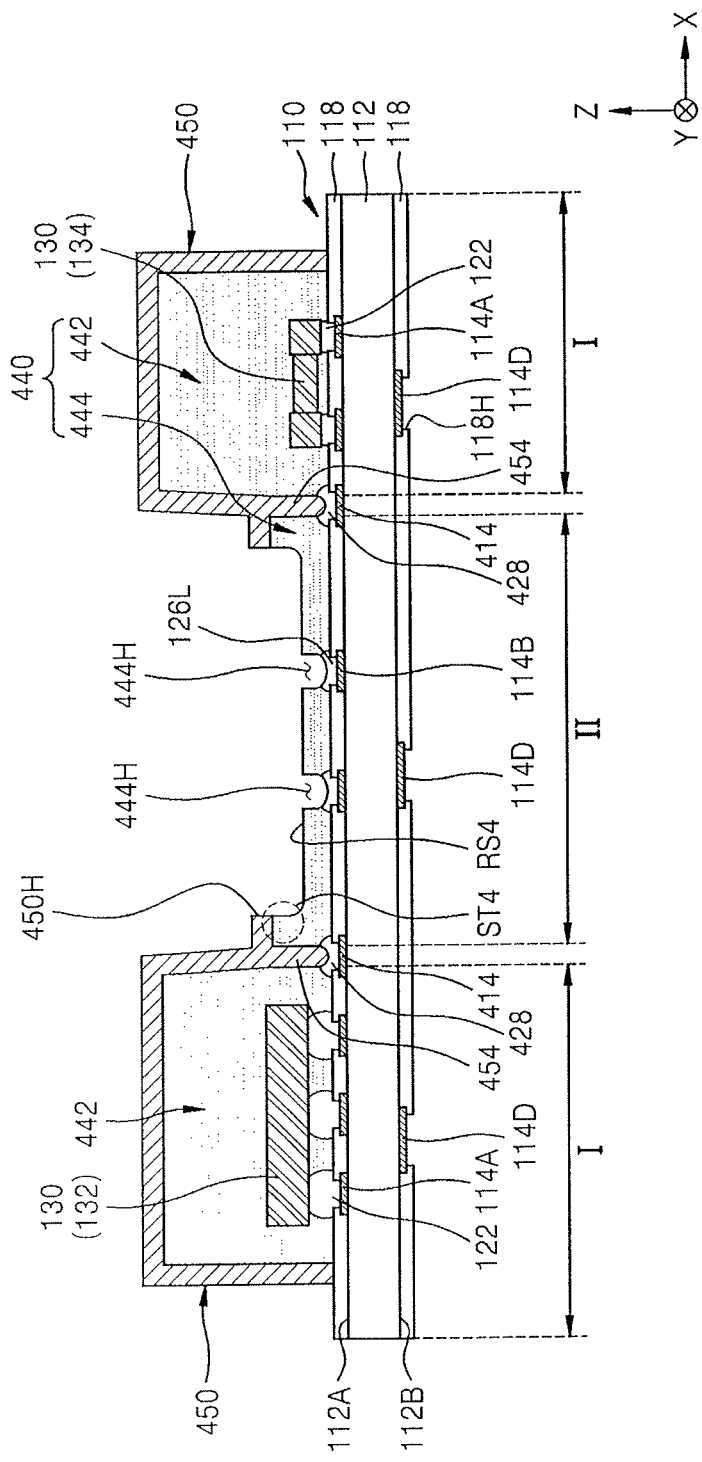

Referring to FIG. 7D, in similar methods to the methods described with reference to FIGS. 5E and 5F, the opening 450H is formed by partially removing the electromagnetic shielding film 450 over the second region II, and the substrate protective molding unit 444 exposed as a result is removed from the top surface thereof as much as a certain thickness, thereby forming the step ST4 and the recess surface RS4 on the top surface of the substrate protective molding unit 444, the recess surface RS4 being defined by the step ST4. Next, some areas selected from the recess surface RS4 of the substrate protective molding unit 444 on the second region II are removed, thereby forming connection holes 444H, which expose the lower connection member 126L.

Figure 7E:
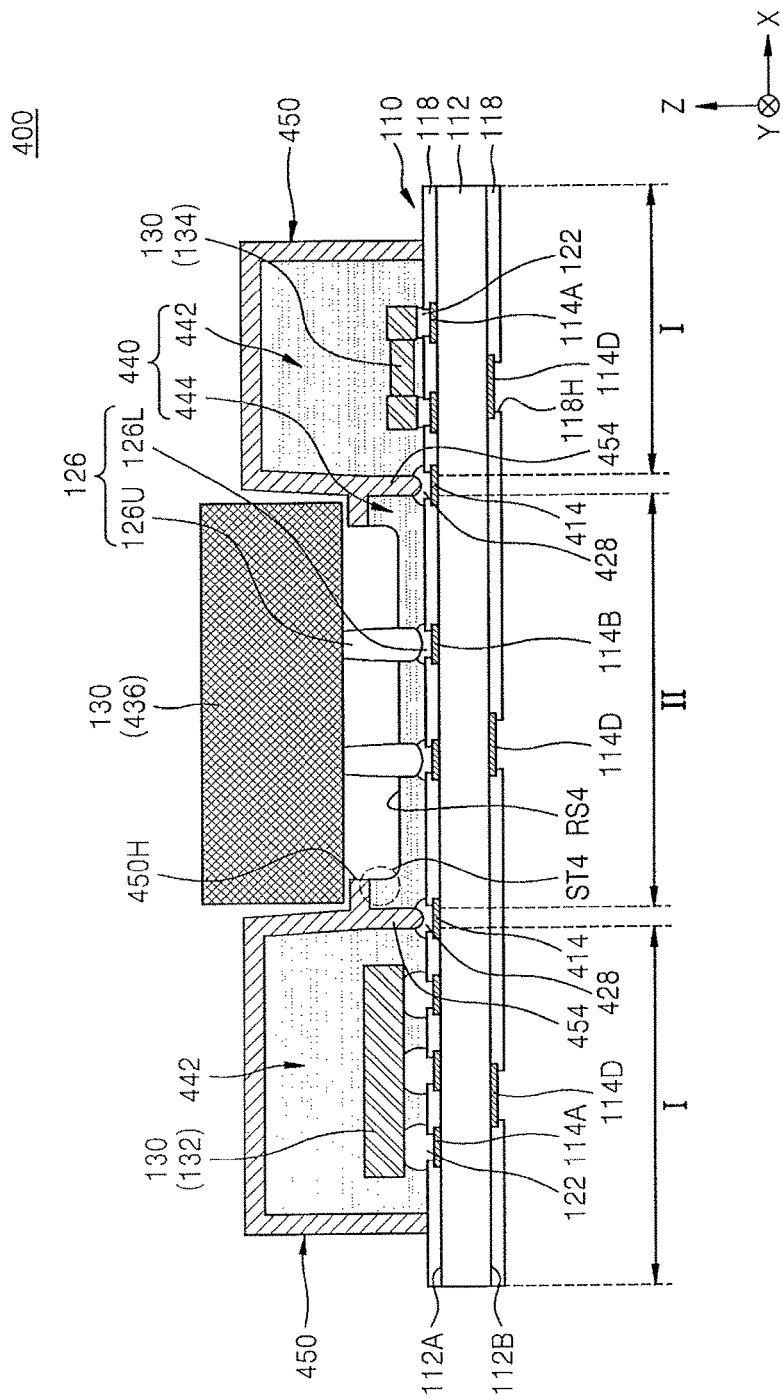

Referring to FIG. 7E, in a similar method to the method described with reference to FIG. 5G, the second connection member 126 having a double-layer structure is formed by forming the upper connection member 126U, followed by mounting the second chip 436 over the second region II via the second connection member 126, thereby fabricating the integrated circuit package 400 shown in FIG. 4.

According to the methods of fabricating the integrated circuit packages 100, 200, 300, and 400, which have been described with reference to FIGS. 5A to 7E, in an SiP module including the first chips 132 and 134, which require electromagnetic shielding by the electromagnetic shielding film 150, 350, or 450, and the second chip 136, 236, or 436, which does not require electromagnetic shielding by the electromagnetic shielding film 150, 350, or 450 or needs to be exposed to a light-permeable environment, a separation distance between the electromagnetic shielding film 150, 350, or 450 and the second chip 136, 236, or 436 exposed outside the electromagnetic shielding film 150, 350, or 450 may be removed or minimized, thereby improving electromagnetic shielding capabilities of each package and suppressing an increase in size of each package due to the separation distance. In addition, the second chip 136, 236, or 436 is mounted over the printed circuit board 110 after forming the molding unit 140 or 440 and the electromagnetic shielding film 150, 350, or 450, whereby the second chip 136, 236, or 436 is not exposed to an atmosphere of the formation processes of the electromagnetic shielding film 150, 350, or 450 and/or the molding unit 140 or 440. Therefore, the possibility of surface contamination of the second chip 136, 236, or 436 can be removed. In particular, when a sensor, which senses an external environment, for example, light or a bio-signal, through an exposed surface of the second chip 136, 236, or 436, is configured, the second chip 136, 236, or 436 is mounted after forming the molding unit 140 or 440 and the electromagnetic shielding film 150, 350, or 450, like in the methods according to embodiments, whereby the performance deterioration of the sensor can be prevented by suppressing the surface contamination of the second chip 136, 236, or 436.

Although the integrated circuit packages 100, 200, 300, and 400 and the fabrication methods thereof according to embodiments have been described with reference to FIGS. 1 to 7E, embodiments are not limited to the examples shown in FIGS. 1 to 7E, and various changes and modifications can be made without departing from the spirit and scope of the disclosure. For example, although FIGS. 1 to 7E illustrate the structures, in which the second chip 136, 236, or 436 constituting the integrated circuit package 100, 200, 300, or 400 is arranged in an approximately central portion of the electromagnetic shielding film 150, 350, or 450 and the electromagnetic shielding film 150, 350, or 450 has a shape completely surrounding the second chip 136, 236, or 436 in a plan view, and the fabrication methods thereof, embodiments are not limited to the examples set forth above. For example, the second chip 136, 236, or 436 may be arranged at an edge of the electromagnetic shielding film 150, 350, or 450 such that the electromagnetic shielding film 150, 350, or 450 partially surrounds the second chip 136, 236, or 436. In addition, although the examples, in which one opening 150H, 350H, or 450H is formed in the electromagnetic shielding film 150, 350, or 450, have been illustrated, embodiments are not limited to the examples set forth above. For example, a plurality of openings 150H, 350H, or 450H may be formed in the electromagnetic shielding film 150, 350, or 450, and a plurality of second chips 136, 236, or 436 may be mounted over the second region II in correspondence to the plurality of openings 150H, 350H, or 450H. In this case, the plurality of second chips 136, 236, or 436, which are mounted over the single printed circuit board 110, may perform the same function, and at least some thereof may perform different functions.

Figure 8A:
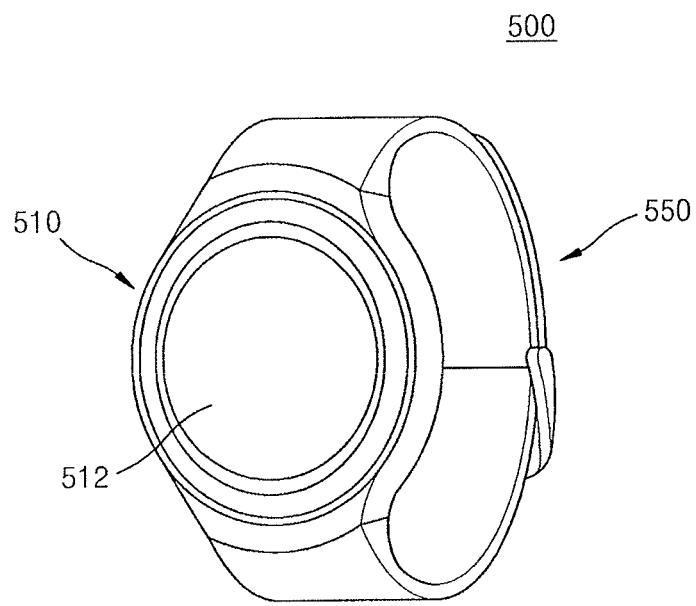
FIGS. 8A and 8B illustrate diagrams of a wearable device according to embodiments.
Figure 8B:
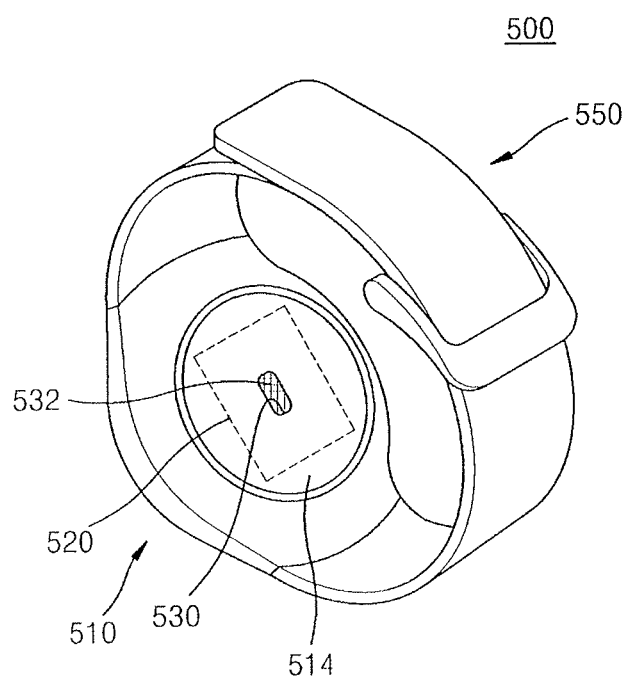

FIGS. 8A and 8B are diagrams illustrating a wearable device according to embodiments. A wearable device 500 configured as a body-wearable electronic device will be described in detail with reference to FIGS. 8A and 8B.

Referring to FIGS. 8A and 8B, the wearable device 500 includes a main body 510 and an attachment unit 550 to attach the main body 510 to a user. As used herein, the term "user" may refer to a person, an animal, a plant, or a device, for example, an artificial intelligence electronic device, which uses an electronic device.

Various circuit devices, e.g., as an application processor (AP), a communication circuit, a memory device, and the like may be embedded in the main body 510. A display 512 may be arranged on a front surface of the main body 510. An integrated circuit package 520 including a sensor may be embedded in the main body 510. The integrated circuit package 520 may include a sensor module, for example, a sensor module including a bio-signal sensing sensor and the like.

The integrated circuit package 520 may include at least one integrated circuit package selected from among the integrated circuit packages 100, 200, 300, and 400 and integrated circuit packages having structures changed or modified therefrom without departing from the spirit and scope of the disclosure.

A window 530 may be formed on a back surface 514 of the main body 510 and expose a sensor chip included in the integrated circuit package 520 to the outside of the integrated circuit package 520 such that the sensor chip is able to provide signals to the outside of the integrated circuit package 520. The window 530 may be blocked by a protective film 532 including a material transparent to light. For example, the second chip 136, 236, or 436 constituting the integrated circuit package 100, 200, 300, or 400 described with reference to FIGS. 1 to 4 may send information to and receive information from the outside of the integrated circuit package 100, 200, 300, or 400 through the protective film 532.

The sensor chip constituting the integrated circuit package 520 may be mounted to be visible from the outside of the integrated circuit package 520 through the window 530 on the back surface 514 of the main body 510, whereby the sensor chip constituting the integrated circuit package 520, for example, the second chip 136, 236, or 436, may face a body part of a user when the user wears the wearable device 500.

The sensor chip of the integrated circuit package 520 may detect information on the health status of a user, for example, at least one of blood pressure, heart rate variability (HRV), heart rate monitor (HRM), photoplethysmograph (PPG), sleep interval, skin temperature, heart rate, blood flow, blood sugar, oxygen saturation, pulse wave, and electrocardiogram (ECG).

The attachment unit 550 allows the main body 510 to be attached to a user, e.g., a body part, clothing, collar, and so forth, and may have various structures, e.g., a band, a strap, a chain, a clasp, and the like, without being limited to the shape shown in FIGS. 8A and 8B. For example, the wearable device 500 may be worn by a wrist of a user by using the attachment unit 550. The wearable device according to embodiments are not limited to the shape shown in FIGS. 8A and 8B, and may be realized as various communication devices or medical devices.

Figure 9:
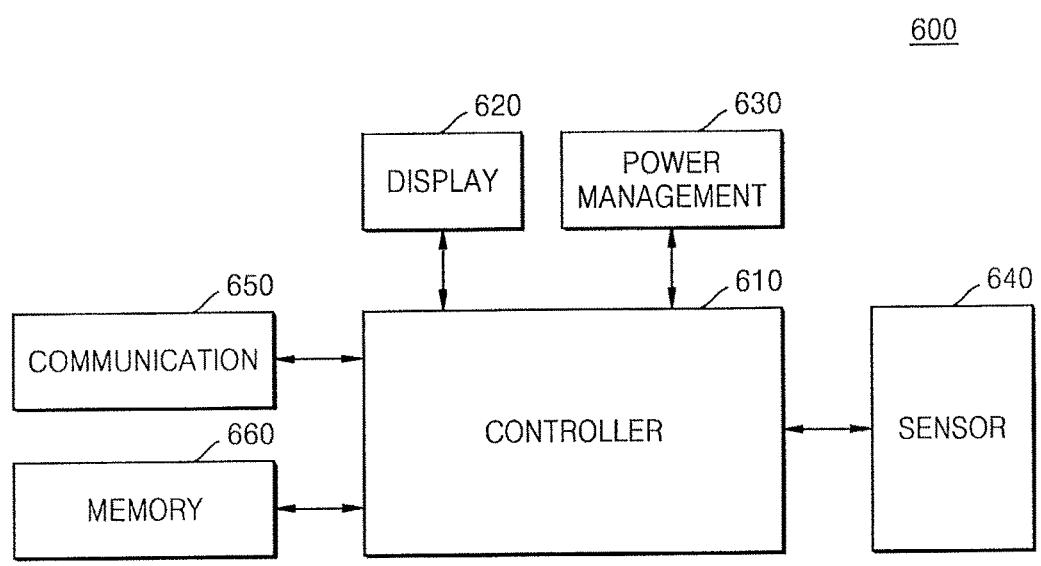
FIG. 9 illustrates a block diagram of a wearable device according to embodiments.

FIG. 9 is a block diagram of a wearable device according to embodiments. Referring to FIG. 9, a wearable device 600 may include a controller 610, a display 620, a power management module 630, a sensor module 640, a communication module 650, and a memory 660.

The controller 610 may include at least one of a central processing unit (CPU), an application processor (AP), a communication processor (CP), and a microcontroller unit (MCU). For example, the controller 610 may control at least one component included in the wearable device 600 or perform communication between a plurality of components and/or data processing.

The display 620 may include a panel, a hologram device, or a projector.

The power management module 630 may manage power of the wearable device 600. For example, the power management module 630 may include a power management integrated circuit (PMIC), a charger integrated circuit, a battery, or a fuel gauge. The communication module 650 may perform data transmission and reception between the wearable device 600 and another electronic device (for example, a smart phone) external to the wearable device 600 through wired/wireless communication.

The sensor module 640 may convert measured or sensed information into an electrical signal by measuring a physical quantity or sensing operation status of the wearable device 600. The sensor module 640 may include a biosensor, a distance sensor, a temperature sensor, or a motion sensor. The biosensor may sense various types of bio-information of a user and send the bio-information to the outside of the biosensor. The bio-information may include pulse rate, oxygen saturation, calorie consumption, pulse pressure, body temperature, electrocardiogram, body fat, activity, or blood pressure, but embodiments are not limited to the examples set forth above.

The wearable device 600 may include at least one of the integrated circuit packages 100, 200, 300, and 400 described with reference to FIGS. 1 to 4, and the sensor module 640 may include at least one of the second chips 136, 236, and 436 described with reference to FIGS. 1 to 4.

The communication module 650 may communicate with an electronic device external to the wearable device 600 in various communication methods. For example, the communication methods may include long term evolution (LTE), wideband code division multiple access (WCDMA), global system for mobile communication (GSM), wireless fidelity (WiFi), Bluetooth, and near field communication (NFC).

The memory 660 may include volatile and/or non-volatile memory. For example, the memory 660 may store a command or data related to at least one of other components of the wearable device 600.

By way of summation and review, one or more embodiments provides an integrated circuit package and a wearable device including the integrated circuit package, the integrated circuit package having a structure capable of improving electromagnetic shielding capabilities and suppressing an increase in size thereof due to a separation distance between an electromagnetic shielding structure and a chip exposed outside the electromagnetic shielding structure by minimizing the separation distance in an SiP module including a chip requiring electromagnetic shielding by the electromagnetic shielding structure and a chip required to be exposed to a light-permeable environment.

Since the integrated circuit package and the wearable device according to embodiments allow the separation distance between the electromagnetic shielding structure and the chip exposed outside the electromagnetic shielding structure to be minimized, the integrated circuit package and the wearable device can have a minimized size as well as exhibit improved electromagnetic shielding capabilities.

In addition, one or more embodiments provides a method of fabricating an integrated circuit package in the fabrication of an SiP module including a chip requiring electromagnetic shielding by an electromagnetic shielding structure and a chip required to be exposed to a light-permeable environment, the method being capable of minimizing the possibility of contamination, which may be caused in the process of fabrication of the SiP module, and preventing an unnecessary increase in size of the integrated circuit package by easily controlling relative positions of the electromagnetic shielding structure and the chip exposed outside the electromagnetic shielding structure and a distance therebetween.

In fabricating an SiP module including a chip requiring electromagnetic shielding by an electromagnetic shielding structure and a chip required to be exposed to a light-permeable environment, the method of fabricating an integrated circuit package can minimize the possibility of contamination, which may be caused in the process of fabricating the SiP module, and can prevent an unnecessary increase in size of the integrated circuit package by easily controlling relative positions of the electromagnetic shielding structure and the chip exposed outside the electromagnetic shielding structure and a distance therebetween.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit package, comprising:
a printed circuit board;
a first chip mounted over a first region of a mounting surface of the printed circuit board;
a first connection member electrically connecting the first chip to the printed circuit board;
a second chip mounted over a second region of the mounting surface;
a second connection member electrically connecting the second chip to the printed circuit board;
a molding unit covering the first region of the mounting surface of the printed circuit board and surrounding the first chip; and
an electromagnetic shielding film between the molding unit and the second chip, the electromagnetic shielding film being directly on the molding unit, wherein the electromagnetic shielding film includes a first shielding portion extending from the molding unit towards the second chip and under the second chip.

2. An integrated circuit package, comprising:
a printed circuit board;
a first chip mounted over a first region of a mounting surface of the printed circuit board;
a first connection member electrically connecting the first chip to the printed circuit board;
a second chip mounted over a second region of the mounting surface;
a second connection member electrically connecting the second chip to the printed circuit board;
a molding unit covering the first region of the mounting surface of the printed circuit board and surrounding the first chip; and
an electromagnetic shielding film between the molding unit and the second chip, the electromagnetic shielding film being directly on the molding unit, wherein at least an upper surface of the second chip is exposed outside the electromagnetic shielding film.

3. The integrated circuit package as claimed in claim 2, wherein the electromagnetic shielding film surrounds the molding unit.

4. The integrated circuit package as claimed in claim 2, wherein the electromagnetic shielding film includes a second shielding portion that extends along a first sidewall of the molding unit, the first sidewall facing the second chip.

5. The integrated circuit package as claimed in claim 4, wherein the second shielding portion extends along an entirety of the first sidewall of the molding unit.

6. The integrated circuit package as claimed in claim 4, wherein the electromagnetic shielding film includes a first shielding portion that extends from the second shielding portion.

7. The integrated circuit package as claimed in claim 6, wherein the first shielding portion extends from the second shielding portion along an upper surface of the molding unit.

8. The integrated circuit package as claimed in claim 5, wherein the electromagnetic shielding film includes a third shielding portion that extends from the second shielding portion over the molding unit and away from the second chip.

9. The integrated circuit package as claimed in claim 2, wherein the electromagnetic shielding film extends along an upper surface of the molding unit.

10. The integrated circuit package as claimed in claim 2, wherein the molding unit is higher than the second connection member.

11. The integrated circuit package as claimed in claim 2, further comprising another molding unit that at least partially covers the second region of the mounting surface of the printed circuit board and at least partially surrounding the second connection member, wherein the electromagnetic shielding film includes a shielding portion between the molding unit and the other molding unit, while at least the upper surface of the second chip is exposed outside the shielding portion.

12. The integrated circuit package as claimed in claim 2, wherein a sidewall of the second chip is exposed by the electromagnetic shielding film.

13. An integrated circuit package, comprising:
a printed circuit board;
a first chip mounted over a first region of a mounting surface of the printed circuit board;
a first connection member electrically connecting the first chip to the printed circuit board;
a second chip mounted over a second region of the mounting surface;
a second connection member electrically connecting the second chip to the printed circuit board;
a molding unit covering the first region of the mounting surface of the printed circuit board and surrounding the first chip; and
an electromagnetic shielding film including a first shielding portion extending along a first sidewall of the molding unit, the first sidewall facing the second connection member, the electromagnetic shielding film being directly on the molding unit, wherein at least an upper surface of the second chip is exposed outside the electromagnetic shielding film.

14. The integrated circuit package as claimed in claim 13, wherein the electromagnetic shielding film includes a second shielding portion that extends from the first shielding portion over the molding unit and away from the second chip.

15. The integrated circuit package as claimed in claim 14, wherein the electromagnetic shielding film includes a third shielding portion that extends from the second shielding portion along a second sidewall of the molding unit and toward the printed circuit board.

16. The integrated circuit package as claimed in claim 15, wherein the electromagnetic shielding film surrounds the molding unit.

17. The integrated circuit package as claimed in claim 13, wherein the first shielding portion extends along an entirety of the first sidewall of the molding unit.

18. The integrated circuit package as claimed in claim 13, wherein the molding unit is higher than the second connection member.

19. The integrated circuit package as claimed in claim 13, further comprising another molding unit that at least partially covers the second region of the mounting surface of the printed circuit board and at least partially surrounding the second connection member while exposing at least the upper surface of the second chip.

20. The integrated circuit package as claimed in claim 19, wherein the second chip is spaced apart from the other molding unit.

21. The integrated circuit package as claimed in claim 19, wherein the molding unit and the other molding unit are connected to each other as one body.

22. The integrated circuit package as claimed in claim 13, wherein a sidewall of the second chip is exposed by the electromagnetic shielding film.

\* \* \* \* \*